(12) United States Patent
Shao et al.

(10) Patent No.: US 10,969,513 B2
(45) Date of Patent: Apr. 6, 2021

(54) TEMPERATURE CORRECTION OF NMR RELAXATION TIME DISTRIBUTIONS

(71) Applicant: Halliburton Energy Services, Inc., Houston, TX (US)

(72) Inventors: Wei Shao, Conroe, TX (US); Songhua Chen, Katy, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 122 days.

(21) Appl. No.: 16/377,469

(22) Filed: Apr. 8, 2019

(65) Prior Publication Data

US 2020/0319369 A1 Oct. 8, 2020

(51) Int. Cl.
*G01V 3/38* (2006.01)
*G01V 3/32* (2006.01)
*G01N 24/08* (2006.01)

(52) U.S. Cl.
CPC ............. *G01V 3/38* (2013.01); *G01N 24/081* (2013.01); *G01V 3/32* (2013.01)

(58) Field of Classification Search
CPC .......... G01V 3/38; G01V 3/32; G01N 24/081; G01R 33/50; G01R 33/448; G01R 33/3808; G01R 33/31
See application file for complete search history.

(56) References Cited

U.S. PATENT DOCUMENTS

| 6,115,671 A | 9/2000 | Fordham et al. |
| 2004/0253743 A1 | 12/2004 | Freed |
| 2014/0253116 A1 | 9/2014 | Freedman et al. |
| 2017/0293007 A1 | 10/2017 | Morgan et al. |
| 2017/0315257 A1 | 11/2017 | Coman et al. |
| 2018/0017699 A1* | 1/2018 | Sandor ................... E21B 49/08 |

OTHER PUBLICATIONS

Straley, et al., "A Mechanism for the Temperature Dependence of the Surface Relaxation Rate in Carbonates", SCA 2002, 2002, 12 pages.
PCT Application Serial No. PCT/US2019/026496, International Search Report, dated Jan. 8, 2020, 3 pages.
PCT Application Serial No. PCT/US2019/026496, International Written Opinion, dated Jan. 8, 2020, 6 pages.
Godefroy, et al., "Temperature Effect on NMR Surface Relaxation", Society of Petroleum Engineers Inc., SPE Annual Technical Conference & Exhibition, Sep. 30-Oct. 3, 2001, New Orleans, LA, 2001, 13 pages.
Godefroy, et al., "Temperature Effect on NMR Surface Relaxation in Rocks for Well Logging Applications", J. Phys. Chem. B, vol. 106, No. 43, Oct. 9, 2002, pp. 11183-11190.

* cited by examiner

*Primary Examiner* — Rishi R Patel
(74) *Attorney, Agent, or Firm* — Gilliam IP PLLC

(57) ABSTRACT

A method includes generating a temperature-corrected nuclear magnetic resonance (NMR) measurement-derived value corresponding to a target temperature using at least one of a dimension-reduction operation or a parameter-correlation operation based on a difference between the target temperature and a sample temperature. The method also includes determining a formation property based on the temperature-corrected NMR measurement-derived value corresponding to the target temperature.

20 Claims, 26 Drawing Sheets

TEMPERATURE CORRECTION OF NMR RELAXATION TIME DISTRIBUTIONS

BACKGROUND

The disclosure generally relates to the field of measurement, and more particularly to using nuclear magnetic resonance (NMR) measurements.

Various well operations, such as stimulation operations and drilling operations, include activities to measure formation properties using NMR methods. NMR equipment can be positioned on wireline tools and/or drilling tools in a borehole of the formation. NMR equipment can also be positioned above the formation and can make surface measurements. An NMR measurement can be interpreted as a signal or set of signals, from which measurements such as NMR peak amplitudes and NMR relaxation time distributions can be determined.

BRIEF DESCRIPTION OF THE DRAWINGS

Aspects of the disclosure may be better understood by referencing the accompanying drawings.

DESCRIPTION OF EMBODIMENTS

Figure 1:
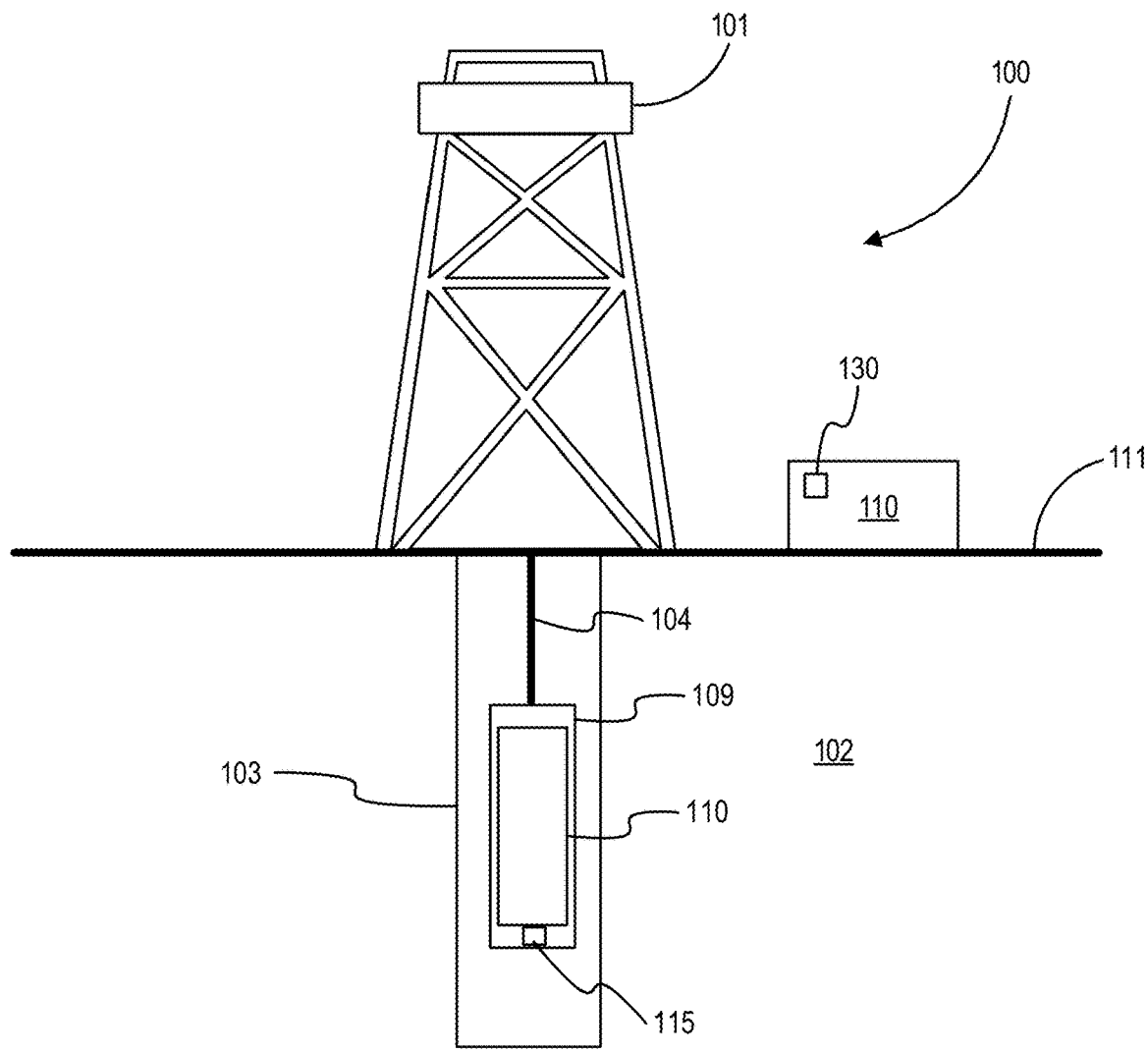
FIG. 1 is an elevation view of a wireline system operating an NMR tool.

The description that follows includes example systems, methods, techniques, and program flows that embody elements of the disclosure. However, it is understood that this disclosure can be practiced without these specific details. For instance, this disclosure refers to NMR measurements acquired on a tool in a borehole. Aspects of this disclosure can instead be applied to NMR measurements acquired in other locations, such as on the surface of the earth or in a subsea environment. In other cases, well-known instruction instances, protocols, structures and techniques have not been shown in detail in order not to obfuscate the description.

Various embodiments can relate to a correction method for NMR measurements and related devices or systems. The correction method can provide increased accuracy when NMR relaxation time distribution values are affected by physical phenomena such as temperature-dependent NMR signals, wherein an NMR relaxation time distribution can be expressed as a set of values and/or a vector comprising the set of values. A method can include generating a set of components based on the NMR relaxation time distribution values, generating a second set of components based on the first set of components and a temperature difference between a target temperature and a sample temperature, wherein the sample temperature is temperature of the sample during measurement of the NMR signals. As used herein, a component can be a principal component and can be represented by a vector, an array of values, etc. The method can also include generating the second set of components based on a calibration model that can itself be based on calibration NMR relaxation time measurements. In some embodiments, the method can include generating calibration NMR relaxation time distributions based on calibration formation samples, wherein each of the calibration NMR relaxation time distributions can be taken at a different calibration temperature.

The temperature dependence of the NMR relaxation time distributions of fluids in formations such as carbonate rock formations can affect relaxation time distributions such as a T1 relaxation time distribution ("T1 distribution") and/or a T2 relaxation time distribution ("T2 distribution"). In some embodiments, the system can also use values based on a relaxation time distribution such as a geometric mean of the T1 distribution ("$T1_{GM}$") or a geometric mean of the T2 distribution ("$T2_{GM}$"), etc. This temperature dependence can be caused by different mechanisms, leading to non-linear and even contradictory macroscale effects on T1 and T2 based on changes in temperature. These relaxation times can be used to determine formation properties for various NMR petrophysical models. These NMR petrophysical models can include the Coates permeability model, Schlumberger-Doll-Research model, pore typing models, models based on capillary bound and clay bound cutoff values and based on pore size distribution models.

The correction method can include generating a temperature-corrected NMR measurement-derived value corresponding to a target temperature, wherein the temperature-corrected NMR measurement-derived value can include values such as a temperature-corrected NMR relaxation time distribution value and/or a geometric mean of an NMR relaxation time distribution (e.g. $T2_{GM}$). The method can generate the temperature-corrected NMR measurement-derived value based on at least one of a dimension reduction operation or a parameter-correlation operation based on a temperature difference between a target temperature and a sample temperature. In some embodiments, the method can include acquiring one or more sample NMR relaxation time distribution values at a sample temperature. The method can include dimension reduction operations and generate a set of sample components based on a dimension-reduced model and the sample temperature. The method can then generate a fitted, weighted set of components based on a fitting of the one or more sample NMR relaxation time distribution values with the set of sample components within a fitting threshold. The fitted, weighted set of sample components can then be used to generate a set of temperature-corrected components based on a temperature difference between the sample temperature and a target temperature. The method can then include using the set of temperature-corrected components to generate one or more temperature-corrected NMR relaxation time distribution values at the target temperature and use these one or more temperature-corrected NMR relaxation time distribution values to determine one or more other formation properties.

In addition, the method can include generating the dimension-reduced model by acquiring a plurality of NMR relaxation time distributions at different calibration temperatures, wherein each of the resulting NMR calibration time distributions comprise a plurality of NMR relaxation time distribution values. The method can then include using a dimension-reduction operation that generates a dimension-reduced model based on the calibration NMR relaxation time distributions. For example, and as further described below for FIG. 3, the method can include applying Principal Component Analysis (PCA) to the calibration NMR relaxation time distributions to generate a set of calibration components which can be used to generate the dimension-reduced model. The dimension-reduced model can then be used as described above.

Alternatively, a temperature-correction method can include generating a temperature-corrected NMR measurement-derived value using one or more parameter-correlation operations that includes using a correlation model comprising pair of parameters. One of the pair of parameters can be based on a temperature and another of the pair parameters can be based on an NMR relaxation time distribution value and/or a non-time-measured formation property, wherein a non-time-measured formation property is a formation property that can be measured in units other than time. The correlation model can be applied to an acquired sample NMR relaxation time distribution value based on a temperature difference between the sample temperature and a target temperature to determine a temperature-corrected time distribution value for the target temperature. The method can then include determining a formation property based on the temperature-corrected time distribution value.

In some embodiments, similar to the operations described above, the method can include generating calibration NMR relaxation time distributions, wherein each of the calibration NMR relaxation time distributions can be taken at a different calibration temperature. The method can include then generating a set of correlation models, wherein each of a first parameter of one of the correlation models is equal to or otherwise based on temperature values and each of a second parameter of one of the correlation models is based on a calibration NMR relaxation time distribution value. For example, the second parameter can be or $T2_{GM}$ or log ($T2_{GM}$). The method can then include selecting a selected correlation model from a set of correlation models by comparing their corresponding calibration performance values. Example calibration performance values can include a root mean squared error (RMSE), a least average slope, and/or a least slope deviation.

By applying the temperature correction methods disclosed herein, various NMR relaxation time distribution values and their corresponding formation properties can be predicted with greater accuracy in real-world NMR measurements. For example, a device or system can acquire a sample NMR relaxation time distribution value from a formation at 86 degrees Celsius and use the temperature correction operations disclosed herein to generate a temperature-corrected NMR relaxation time distribution value corresponding to a temperature of 22 degrees Celsius. By correcting the NMR relaxation time distribution value to account for a temperature change, the device or system also increases the accuracy of formation property predictions based on the NMR relaxation time distribution values. Using the methods described herein, the device or system can use the temperature correction method disclosed herein to increase the accuracy when predicting formation properties such as pore sizes, permeability, and pore-throat size. For example, a device or system can acquire a sample NMR relaxation time distribution value from a formation at 86 degrees Celsius and use the temperature correction operations disclosed herein to generate a temperature-corrected NMR relaxation time distribution value corresponding to a temperature of 22 degrees Celsius, and then use the temperature-corrected NMR time relaxation distribution value to predict an average pore throat size of the formation.

Example Systems

FIG. 1 is an elevation view of a wireline system operating an NMR tool. An NMR tool 109 disposed in a borehole 103 penetrating the earth surface 111, which includes a formation 102. The formation 102 can include pores and/or micro-fractures containing and hydrocarbons. The NMR tool 109 can be disposed into the borehole 103 by a conveyance 104. While shown as a wireline, in some embodiments, the conveyance 104 can be a wireline, a pipe, etc. In addition to supporting the NMR tool 109 disposed in the borehole 103, the conveyance 104 can also provide communications between the NMR tool 109 and a surface system 110 disposed at the earth surface 111. In logging-while-drilling (LWD) or measurement-while-drilling (MWD) embodiments, the conveyance 104 can be a drill string. In order to operate the NMR tool 109 and/or provide a communications interface with the surface system 110, the NMR tool 109 includes a processor 115. The processor 115 can be used to operate the NMR tool 109 and/or process measurements or data received from the tool 10. NMR data processing or operations can also be performed by the surface system 110 in addition to or in lieu of the processor 115, wherein the surface system 110 includes the processor 130.

The NMR tool 109 includes an NMR component 110 configured to perform NMR measurements on a sensitive volume in the formation 4. The NMR component 110 can include a magnet arrangement that can generate a static magnetic field having a substantially uniform field strength in the sensitive volume in the formation surrounding the borehole. A radiofrequency (RF) coil or antenna can be used to produce pulsed RF fields substantially orthogonal to the static field in the region of examination. The nuclear spins in the formation align themselves along the externally applied static magnetic field. A pulsed RF field can be applied to tip the spins into the transverse plane, resulting in a precession of the spins. A tipping pulse can be followed by a series of refocusing pulses and the resulting series of pulse echoes can be detected by a receiver coil or antenna. In some embodiments, the sequence of pulses can be a Carr-Purcell-Meiboom-Gill sequence (CPMG sequence). An alternative sequence may be used such as to maximize signal and minimize RF power consumption. The NMR tool can measure and/or calculate NMR relaxation time distribution values such as a longitudinal relaxation decay time constant (referred to as T1) and a transverse relaxation decay time constant (referred to as T2).

Figure 2:
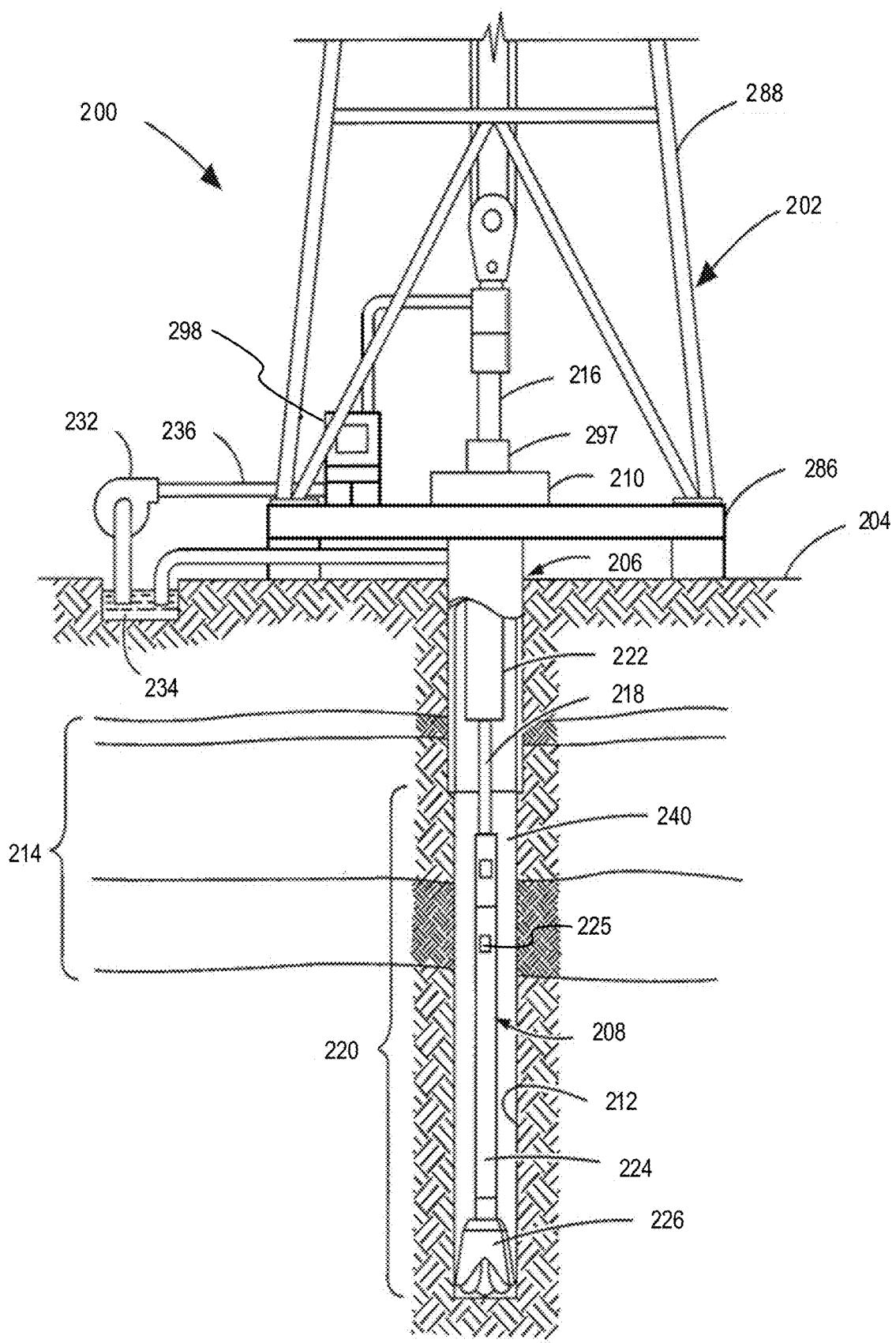
FIG. 2 is an elevation view of a drilling system operating an NMR tool.

FIG. 2 is an elevation view of a drilling system operating an NMR tool. FIG. 2 shows a drilling system 200 that includes a portion of a drilling rig 202 located at the surface 204 of a well 206. Drilling of oil and gas wells is commonly carried out using a string of drill pipes connected together so as to form a drilling string 208 that is lowered through a rotary table 210 with support structure 297 into a borehole 212. Here a drilling platform 286 can be equipped with a derrick 288 that supports a hoist. The drilling rig 202 may thus provide support for the drill string 208. The drill string 208 may operate to rotate the rotary table 210 for drilling the borehole 212 through subsurface formations 214. The drill string 208 may include a Kelly 216, drill pipe 218, and a bottom hole assembly 220 located at the lower portion of the drill pipe 218.

The bottom hole assembly 220 may include drill collars 222, an NMR tool 224, and a drill bit 226. The drill bit 226 may operate to create a borehole 212 by penetrating the surface 204 and subsurface formations 214. During an NMR measurement operation, the NMR tool 224 disposed in the borehole 212 can transmit and receive RF pulses into and from the subsurface formations 214. The NMR tool 224 can determine NMR relaxation time distribution values based on RF pulse responses from the subsurface formations 214. The NMR tool can then use an internal processor 225 and/or the computer system 298 to determine NMR relaxation time distribution values of the subsurface formations 214 and use the NMR relaxation time distribution values to predict other formation property values. In addition, the NMR tool 224 may comprise any number of other types of tools including measurement while drilling (MWD) tools, logging while drilling (LWD) tools, etc.

During drilling operations, the drill string 208 (perhaps including the Kelly 216, the drill pipe 218, and the bottom hole assembly 220) may be rotated by the rotary table 210. In addition to, or alternatively, the bottom hole assembly 220 may also be rotated by a motor such as a mud motor that is located down hole. The drill collars 222 may be used to add weight to the drill bit 226. The drill collars 222 may also operate to stiffen the bottom hole assembly 220, allowing the bottom hole assembly 220 to transfer the added weight to the drill bit 226, and in turn, to assist the drill bit 226 in penetrating the surface 204 and subsurface formations 214. The computer system 298 can perform some or all of the operations described below in the flowcharts in FIG. 3 and FIG. 4.

In addition, during drilling operations, a mud pump 232 may pump drilling fluid from a mud pit 234 through a hose 236 into the drill pipe 218 and down to the drill bit 226. The drilling fluid can flow out from the drill bit 226 and be returned to the surface 204 through an annular area 240 between the drill pipe 218 and the sides of the borehole 212. The drilling fluid may then be returned to the mud pit 234, where such fluid is filtered. In some embodiments, the drilling fluid can be used to cool the drill bit 226, as well as to provide lubrication for the drill bit 226 during drilling operations. Additionally, the drilling fluid may be used to remove subsurface formation 214 cuttings created by operating the drill bit 226. In some embodiments, the flow rate of the drilling fluid can be increased or reduced in response to a formation property prediction generated using NMR relaxation time distribution values. In some embodiments, the drilling speed and/or the drilling direction of the drill bit 225 can be changed in response to a formation property prediction generated using NMR relaxation time distribution values.

Example Flowcharts

The flowcharts described below are provided to aid in understanding the illustrations and are not to be used to limit scope of the claims. The flowcharts depict example operations that can vary within the scope of the claims. Additional operations may be performed; fewer operations may be performed; the operations shown may be performed in parallel; and the operations shown may be performed in a different order. For example, the operations depicted in blocks 304-332 of FIG. 3 can be performed in parallel or serially. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus, for execution.

Figure 3:
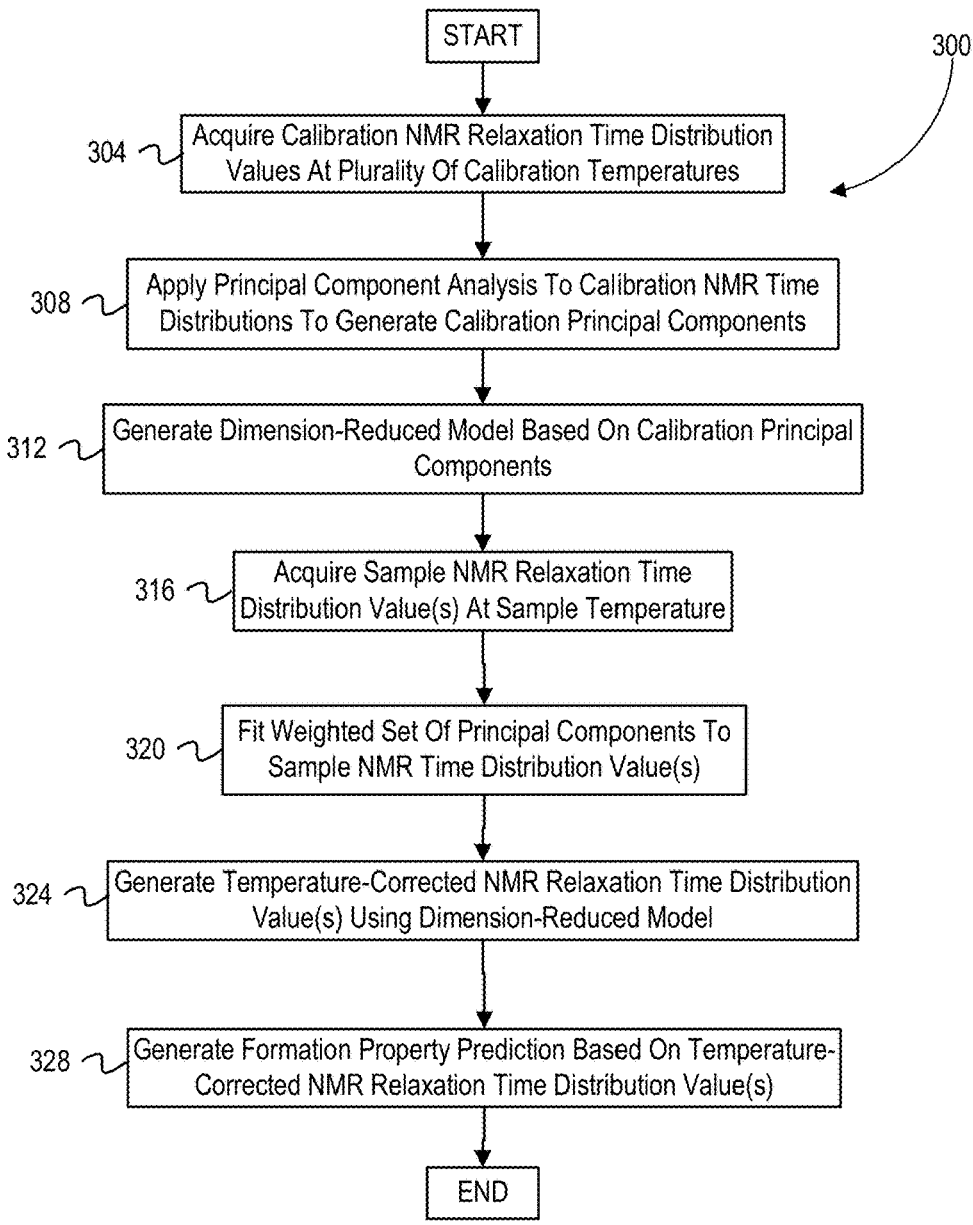
FIG. 3 is a flowchart of operations to generate a formation prediction using on a dimension reduction method.

FIG. 3 is a flowchart of operations to generate a formation prediction using on a dimension reduction method. FIG. 3 depicts a flowchart 300 of operations to generate a formation property prediction using a device or system that includes a processor. For example, operations of the flowchart 300 can be performed using a system similar to the surface system 110 of FIG. 1, the computer system 298 of FIG. 2 or the computer device 2600 of FIG. 26 respectively. Operations of the flowchart 300 can include dimension-reduction operations described further below for at least blocks 308, 312, 320, and/or 324. Operations of the flowchart 300 start at block 304.

At block 304, the device or system acquires calibration NMR relaxation time distribution values at a plurality of calibration temperatures. In some embodiments, the device or system can acquire NMR relaxation time distribution values from wireline NMR tools lowered in a borehole. For example, with reference to FIG. 1, the device or system can acquire the NMR relaxation time distribution values from the NMR tool 109 while or after the NMR tool 109 is being disposed in the borehole 103. Alternatively, the device or system can acquire NMR relaxation time distribution values from an NMR tool 224 (see FIG. 2) attached to a drill string while or after the NMR tool is being disposed in the borehole 212. Furthermore, in some embodiments, the calibration NMR relaxation time distribution values can be acquired from storage media. For example, the calibration NMR relaxation time distribution values can be acquired from a database stored on a server. In some embodiments, the calibration NMR relaxation time distribution values can be visually represented using a plot showing measurements having one or more peaks.

In some embodiments, the NMR relaxation time distribution values can be visually represented using a plot showing measurements having one or more peaks. The NMR relaxation time distribution values can include relaxation times T1, T2, and values based on T1 and/or T2. For example, the NMR relaxation time distribution values can include the geometric mean relaxation time $T2_{GM}$.

At block 308, the device or system can apply PCA to the calibration NMR relaxation time distribution values to generate a set of calibration components. The set of calibration components can include any number of principal components. The set of calibration components can be represented in various forms such as arrays, vectors, functions, etc. In some embodiments, the device or system can generate a pre-determined number of principal components. Alternatively, the device or system can generate a minimum number of principal components that satisfy an accuracy threshold. For example, the device or system can apply PCA to a set of NMR relaxation time distribution values at four calibration temperatures to generate four calibration components, wherein the four calibration components represent over 90% of data variances.

At block 312, the device or system can generate a dimension-reduced model based on the calibration component coefficients and the calibration temperatures. The system can compare the coefficients of the calibration component with each other to determine correlations for each of the principal component coefficients within a temperature range, from the minimum temperature of the calibration temperatures to the maximum temperature of the calibration temperatures—that is, over the range of calibration temperatures. The system can then generate a dimension-reduced model for each of the principal components comprising correlations between principal component coefficient values over temperature changes. In some embodiments, the dimension-reduced model can be applied over a temperature range that is greater than the range of calibration temperatures.

For example, based on a correlations between a set of four calibration components over four calibration temperatures, the device or system can generate a dimension-reduced model comprising the four individual coefficient correlations represented by Equations (1)-(4), wherein $T_S$ is the temperature at which an NMR measurement of a physical sample occurs ("sample temperature"), $T_T$ is a target temperature for which the temperature-corrected principal component is to be calculated, $PCA_{T,i}$ is the i-th principal component at the target temperature $T_T$, and $PCA_{S,i}$ is the i-th principal component for the sample measurement (also known as "sample component" or "sample principal component" herein) at the measured sample temperature $T_S$:

$$PCA_{T,1}=0.4335+1.0045 PCA_{S,1}-0.0089443(T_S-T_T) \quad (1)$$

$$PCA_{T,2}=0.11676+0.75326 PCA_{S,2}-0.0032323(T_S-T_T) \quad (2)$$

$$PCA_{T,3}=-0.16491+0.71417 PCA_{S,3}-0.003238(T_S-T_T) \quad (3)$$

$$PCA_{T,4}=0.054448+0.91788 PCA_{S,4}-0.0030299(T_S-T_T) \quad (4)$$

In some embodiments, the target temperature $T_T$ may comprise an ambient temperature $T_0$ which can be equal to temperatures in a range between 15 degrees Celsius to 30 degrees Celsius (i.e. in some embodiments, $T_T=T_0$). In addition, the sample temperature $T_S$ can also be the ambient temperature $T_0$. In some embodiments, the target temperature can be either greater than or lesser than the sample temperature. For example, the target temperature $T_T$ can be a reservoir temperature such as 50 degrees Celsius and the sample temperature $T_S$ can be an ambient temperature such as 22 degrees Celsius. As an alternative example, the target temperature $T_T$ may comprise an ambient temperature such as 22 degrees Celsius and the sample temperature $T_S$ can be a reservoir temperature such as 50 degrees Celsius. In some embodiments, an "ambient temperature" comprises a range of about 10 degrees Celsius to approximately 43 degrees Celsius.

At block 316, the device or system can acquire one or more sample NMR relaxation time distribution values at a sample temperature. In some embodiments, the device or system can acquire the sample NMR relaxation time distribution values using methods similar to or the same as the methods disclosed for block 304. For example, the device or system can acquire the sample NMR measurements using the same NMR tool used to acquire the calibration NMR relaxation time distribution values. Alternatively, the device or system can acquire the NMR measurements using a different NMR tool and/or acquire the sample NMR measurements from a different borehole. Furthermore, in some embodiments, the sample NMR relaxation time distribution values can be acquired from storage media. For example, the sample NMR relaxation time distribution values can be acquired from a database stored on a server.

At block 320, the device or system can fit a weighted set of components to the one or more sample NMR relaxation time distribution values. The device or system can generate the fitted weighted set of components by first generating the sample components $PCA_{S,i}$ by either directly using calibration components or the dimension-reduced model, as further described below. The device or system can then change the values of the weights $w_i$ of the weighted set $[w_i PCA_{S,i}]$ for each of the i-th sample components in set of N components until the sum of the weighted set of components is within a fitting threshold of the NMR relaxation time distribution, wherein N is the total number of sample components. In some embodiments, the sum of the weighted set of components can be expressed as $\Sigma_{i=1}^{N} w_i PCA_{S,i}$ and can be used to approximate an NMR relaxation time distribution. The device or system can change the values of the weights $w_i$ until a fitting error between the sum of the fitted, weighted set of components and the sample NMR relaxation time distribution values is within an error threshold. The sample NMR relaxation time distribution can have any number of initial elements, such as 10 elements, 54 elements, 1000 elements, etc. For example, the device or system can determine that a weighted set of components is fitted when the relationship shown in inequality (5) is satisfied, wherein Err is a function that can determine an error value between the two distributions "$\Sigma_{i=1}^{N} w_i PCA_{S,i}$" and "$f_{NMR}(T2)$", is a sample NMR relaxation time distribution comprising 54 elements at their respective times t, and $E_{fit}$ is the fitting error:

$$Err\left[\sum_{i=1}^{N} w_i PCA_{S,i}, f_{NMR}(T2)\right] \leq E_{fit} \quad (5)$$

In some embodiments, the temperature corresponding to each of the sample components $PCA_{S,i}$ used for fitting can be different from the sample temperature within a temperature deviation threshold. For example, the temperature deviation threshold can be ±3.0 degrees Celsius. In this same example, the sample temperature can be 50 degrees Celsius and a device or system can use the calibration principal components that were acquired at a calibration temperature of 48 degrees Celsius as the sample components $PCA_{S,i}$ for 50 degrees Celsius because 48 degrees is within the selected temperature deviation threshold of ±3.0 degrees Celsius. Alternatively, the device or system can use the dimension-reduced model to generate a set of components at the same temperature as the sample temperature. For example, the device or system can use Equations (1)-(4) to convert principal components at a predetermined temperature to sample components at the sample temperature.

At block 324, the device or system can generate one or more temperature-corrected NMR relaxation time distribution values using the dimension-reduced model. The temperature-corrected NMR relaxation time distribution values can be a type of temperature-corrected NMR measurement-derived value. In some embodiments, the system can generate one or more temperature-corrected NMR relaxation time distribution values by applying the dimension-reduced model to generate temperature-corrected components from the temperature-fitted, weighted set of components generated above at block 320. The temperature difference can be the difference between the sample temperature $T_S$ and a target temperature equal to $T_T$. For example, the device or system can apply Equations (1)-(4) to generate temperature-corrected components at the ambient temperature 22 degrees Celsius when the sample temperature is 80 degrees Celsius by substituting $T_T=22$ degrees Celsius and $T_S=80$ degrees Celsius to generate the sample principal components represented by Equations (6-9) and their corresponding T2 distribution as represented by Equation (10):

$$PCA_{T,1}=0.4335+1.0045 PCA_{S,1}-0.0089443(80-22) \quad (6)$$

$$PCA_{T,2}=0.11676+0.75326 PCA_{S,2}-0.0032323(80-22) \quad (7)$$

$$PCA_{T,3}=-0.16491+0.71417 PCA_{S,3}-0.003238(80-22) \quad (8)$$

$$PCA_{T,4}=0.054448+0.91788 PCA_{S,4}-0.0030299(80-22) \quad (9)$$

$$T2 \text{Distribution}=w_1 PCA_{T,1}+w_2 PCA_{T,2}+w_3 PCA_{T,3}+w_4 PCA_{T,4} \quad (10)$$

At block 328, the device or system can generate a formation property prediction based on the one or more temperature-corrected NMR relaxation time distribution values. The formation property prediction can also be a type of temperature-corrected NMR measurement-derived value. In some embodiments, the formation property prediction may comprise an NMR relaxation time distribution such as a T1 distribution and/or T2 distribution. For example, the system can generate a temperature-corrected NMR relaxation time distribution value by using one more of the values of the T2 distribution of Equation (10). Alternatively, or in addition, the formation property prediction values may comprise non-time-measured formation properties, such as porosity, permeability, pore cutoff values, bound fluid cutoff values, etc. For example, the device or system can apply a correlation between pore throat size and a geometric mean of the T2 distribution to determine a pore throat size distribution and related pore throat size values (e.g. average pore throat size, range of pore throat sizes, etc). Once the device or system determines the one or more temperature-corrected NMR relaxation time distribution values and/or one or more predicted, temperature-corrected formation property values, operations of the flowchart 300 can be considered to be complete.

Figure 4:
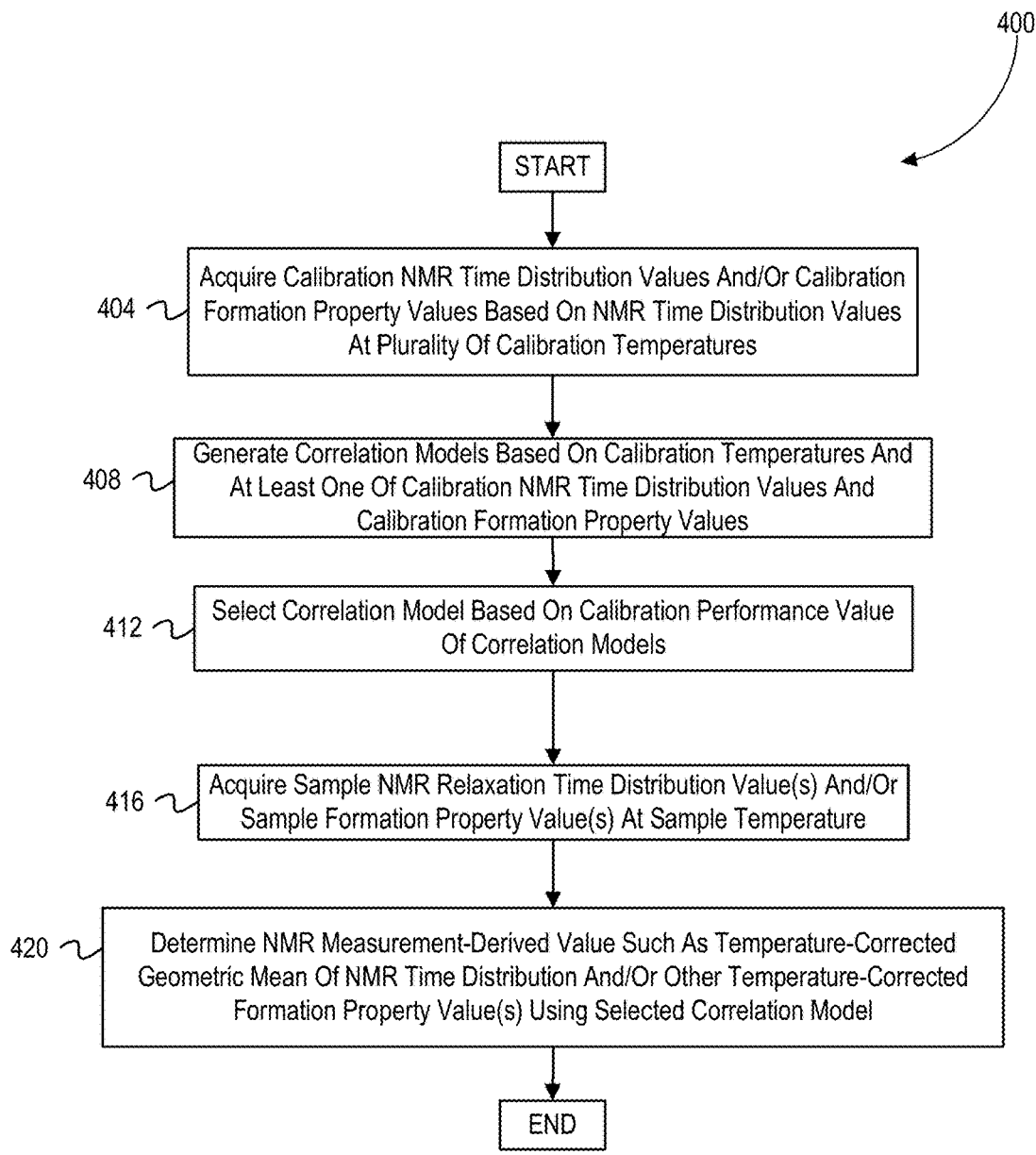
FIG. 4 is a flowchart of operations to generate a parameter-based model and generate a formation property prediction based on the parameter-based model.

FIG. 4 is a flowchart of operations to generate a parameter-based model and generate a formation property prediction based on the parameter-based model. FIG. 4 depicts a flowchart 400 of operations to generate a formation property prediction using a device or system that includes a processor. For example, operations of the flowchart 400 can be performed using a system similar to the surface system 110 of FIG. 1, the computer system 298 of FIG. 2 or the computer device 2600 of FIG. 26, respectively. Operations of the flowchart 400 can include parameter-correlation operations, such as operations described further below at blocks 408, 412, 416, and/or 420. As used herein, a parameter used in a parameter-correlation operation can include an NMR measurement-derived value such as a formation property, a T2 distribution value, a $T2_{GM}$ value, a temperature, etc. Operations of the flowchart 400 start at block 404.

At block 404, the device or system acquires a plurality of calibration NMR relaxation time distribution values and/or other calibration formation property values at a plurality of calibration temperatures. In some embodiments, the device or system can acquire a plurality of calibration NMR relaxation time distribution values from wireline NMR tools—such as the wireline NMR tool 109 in FIG. 1. Alternatively, the device or system can acquire a plurality of calibration NMR relaxation time distribution values based from NMR tools attached to a drill string. For example, with reference to FIG. 2, the device or system can use the NMR tool 224 to acquire calibration NMR relaxation time distribution values. Furthermore, in some embodiments, the calibration NMR relaxation time distribution values can be acquired from storage media. For example, the calibration NMR relaxation time distribution values can be acquired from a database stored on a server. In some embodiments, the calibration NMR relaxation time distribution values and/or other calibration formation property values can be visually represented using a plot showing measurements having one or more peaks. In some embodiments, the other calibration formation property values can be determined by a processor in the device or system, and can include non-time-measured formation property values such as permeability, cutoff values, porosity, etc.

At block 408, the device or system can generate a set of one or more correlation models based on the calibration temperatures and at least one of the calibration NMR relaxation time distribution values and/or other calibration formation property values. Each of the set of correlation models can include a correlation of a two parameter values, wherein at least one of the parameter values vary with temperature and/or temperature differences. In some embodiments, the device or system can use a value based on the calibration NMR relaxation time distribution values. For example, the value can be a geometric mean of the calibration NMR relaxation time distribution such as $T2_{GM}$. In some embodiments, the device or system can use the calibration temperatures directly to generate the one or more correlation models. In addition, the device or system can use values that are correlated with the calibration temperatures. For example, the device or system can generate four correlation models between the calibration temperature T and the geometric mean distribution time $T2_{GM}$ in the form of correlation models such as "$T2_{GM}$ vs T", "$T2_{GM}$ vs 1/T", "$\log(T2_{GM})$ vs T", and $\log(T2_{GM})$ vs 1/T. In some embodiments, these correlation models can be represented as a first variable X and second variable Y in a table. For example, after generating correlation models based on a set of calibration NMR relaxation time distribution values, the device or system can generate the following correlation models represented by Table 1 below, where the "Correlation Model" column is an index value, the "X" column represents the first variable of the correlation model, the "Y" column represents a second variable of the correlation model, the "Mean Slope" column represents a slope value, and "RMSE" represents a root mean squared error (RMSE of the correlation model in this specific case):

TABLE 1

| Correlation Model | X | Y | Mean Slope | RMSE |
|---|---|---|---|---|
| 1 | T | $T2_{GM}$ | 1.24 | 11.4 |
| 2 | 1/T | $T2_{GM}$ | −235648 | 14.1 |
| 3 | T | $\log(T2_{GM})$ | 0.00303 | 9.2 |
| 4 | 1/T | $\log(T2_{GM})$ | −579.4 | 11.1 |

In addition, or alternatively, the device or system can generate one or more correlations models by using non-time-measured formation property values that are correlated with the calibration NMR relaxation time distribution values. For example, the device or system can use micro pore cutoff ("MicroCutoff") values as a formation property or macro pore cutoff ("MacroCutoff") values as a formation property. In addition, the device or system can use values based on porosity sizes to filter outlier values and remove the outlier values from calibration values used to generate correlation models. For example, the device or system can use pore cutoff values such as the MicroCutoff and/or the MacroCutoff to filter outlier data elements that do not satisfy the pore cutoff thresholds. In this example, the device or system can filter outlier data from a correlation model if over 90% of their cumulative pore throat size distribution are outside the bounds of the pore cutoff values. While pore cutoff values are used in this example, other values can be used to filter outliers out from the calibration values used to generate correlation models. For example, a device or system can one or more pore volume threshold, pore connectivity threshold, etc.

The system can then generate a number of correlation models that express the relationship between the calibration temperature T and the formation property values. For example, the device or system can generate correlation models such as "log(MicroCutoff) vs T". Furthermore, in some embodiments, outliers can first be eliminated from a correlation model before determination of one or more calibration performance values corresponding with each correlation model as further described below for block 412. In some embodiments, non-time-measured formation property values can be equal to or be otherwise a function of at least one of a pore throat distribution value, a MicroCutoff value, a MacroCutoff value, a porosity value, a permeability value, and a pore size distribution value.

At block 412, the device or system can select a correlation model based on a calibration performance value of the correlation models. In some embodiments, the device or system can select a correlation model based on a calibration performance value such as model error, model linear regression slope, and/or a slope deviation. For example, the device or system can determine a selected correlation model from the set of correlation models shown in Table 1 above based on which of the correlation models have the least model error, wherein model error may comprise a value such as RMSE or variance. As shown in Table 1, if the correlation model "$\log(T2_{GM})$ vs. T" has the least RMSE, the device or system can select the "$\log(T2_{GM})$ vs. T" correlation model with its corresponding coefficient values.

Alternatively, or in addition, the device or system can select the correlation model from correlation models using the formation properties correlated with the NMR time relaxation distributions. For example, the device or system can select a correlation model from a set of correlation models based on "T vs. MicroCutoff", "1/T vs. MicroCutoff", "T vs. log(MicroCutoff)", or "1/T vs. log(MicroCutoff)". In some embodiments, if the T vs. log(MicroCutoff) and 1/T vs. log(MicroCutoff) has the least slope deviation, the device or system can select these two correlation models to represent a correction to their respective formation properties: MicroCutoff and MacroCutoff.

At block 416, the device or system can acquire one or more sample NMR relaxation time distribution values at a sample temperature, wherein the sample temperature can one of any temperature between 0 degrees Celsius to 300 degrees Celsius. In some embodiments, the device or system can acquire the sample NMR relaxation time distribution values using methods similar to or the same as the methods disclosed for block 304. For example, a system can acquire the sample NMR measurements using the same NMR tool used to acquire the sample NMR relaxation time distribution values. Alternatively, a device can acquire the sample NMR measurements using a different NMR tool and/or acquire the sample NMR measurements from a different formation. Alternatively, or in addition, the device or system can acquire the sample NMR measurements from a data structure stored in an electronic storage medium.

At block 420, the device or system can determine one or more NMR measurement-derived values such as a temperature-corrected geometric mean of a NMR relaxation time distribution and/or one or more other temperature-corrected formation property predictions using the selected correlation model. The system can generate the temperature-corrected NMR relaxation time distribution value by applying the correlation model to a target temperature. In some embodiments, the same correlation model can be used to generate different equations to determine a temperature-corrected $T2_{GM}$ value based on the target temperature corresponding with the temperature correction. For example, Equation (11) below can be used to determine a geometric mean of a target T2 distribution "$T2_{GM,T0,T}$" corresponding with an ambient temperature $T_0$ based on a geometric mean of a measured T2 distribution of a sample "$T2_{GM,T,S}$" acquired at the sample temperature $T_S$. Similarly, Equation (12) below can be used to determine a geometric mean of a target T2 distribution $T2_{GM,T}$ corresponding with a target temperature $T_T$ based on a geometric mean of a measured sample T2 distribution $T2_{GM,T0,S}$ that was acquired at the ambient temperature $T_0$:

$$\log(T2_{GM,T0,T}) = 0.400 - 0.00308(T_S - T_0) - 0.938 \log(T2_{GM,T,S}) \quad (11)$$

$$\log(T2_{GM,T}) = 0.251 + 0.0033(T_T - T_0) + 0.948 \log(T2_{GM,T0,S}) \quad (12)$$

In some embodiments, either during the operations described for block 420 or during the operations described during blocks 408-412 above, the device or system can also discard data based on NMR relaxation time distribution values that do not fit a selected correlation model and re-calculate the correlation model. Specifically, the device or system can discard individual NMR relaxation time distribution values or entire NMR relaxation time distributions based on whether they are within a correlation model fitting threshold of the selected correlation model, and then operate to re-calculate the coefficients of the selected correlation model. For example, if the correlation model fitting threshold is a RMSE less than 0.1, Equation (11) and Equation (12) can be re-calculated to generate Equation (13) and Equation (14) below after discarding the NMR relaxation time distributions having a RMSE value greater than the correlation model fitting threshold:

$$\log(T2_{GM,T0,T}) = 0.0889 - 0.0037(T_S - T_0) - 1.0225 \log(T2_{GM,T,S}) \quad (13)$$

$$\log(T2_{GM,T}) = 0.449 + 0.0036(T_T - T_0) + 0.915 \log(T2_{GM,T0,S}) \quad (14)$$

Equation (15) below can be used to determine an ambient MicroCutoff value MicroCutoff$_{T0}$ corresponding with an ambient temperature $T_0$ based on a sample MicroCutoff value MicroCutoff$_{TS}$ corresponding with a sample temperature $T_S$. Similarly, Equation (16) below can be used to determine an ambient MacroCutoff value MacroCutoff$_{T0}$ corresponding with an ambient temperature $T_0$ based on a sample MacroCutoff value MacroCutoff$_{TS}$ corresponding with a sample temperature $T_S$:

$$\log(\text{MicroCutoff}_{TS}) - \log(\text{MicroCutoff}_{T0}) = -0.079339 + 0.004037(T_S - T_0) \quad (15)$$

$$\log(\text{MacroCutoff}_{TS}) - \log(\text{MacroCutoff}_{T0}) = -0.069506 + 0.003165(T_S - T_0) \quad (16)$$

In some embodiments, either during the operations described for block 420 or during the operations described during blocks 408-412 above, the device or system can also discard formation property data that do not fit a selected correlation model and re-calculate the correlation model. For example, the device or system can discard individual cutoff values or entire cutoff values based on whether they are within a correlation model fitting threshold of the selected correlation model, and then operate to re-calculate the coefficients of the selected correlation model. For example, if the correlation model fitting threshold is a RMSE less than 0.1, Equation (15) and Equation (16) can be re-calculated to generate Equation (17) and Equation (18) below after discarding the cutoff values having a RMSE value greater than the correlation model fitting threshold:

$$\log(\text{MicroCutoff}_{TS}) - \log(\text{MicroCutoff}_{T0}) = -0.0355 + 0.00464(T_S - T_0) \quad (17)$$

$$\log(\text{MacroCutoff}_{TS}) - \log(\text{MacroCutoff}_{T0}) = -0.0775 + 0.0036(T_S - T_0) \quad (18)$$

In some embodiments, the formation property prediction may comprise a time value based on the NMR relaxation time distribution. For example, the formation property prediction values may comprise at least one of the geometric means of the relaxation time distribution values $T1_{GM}$ and $T2_{GM}$, and the device or system can use Equation (13) to determine the ambient geometric mean of the distribution time $T2_{GM,T0,T}$ when T=92 Celsius, T2T=300 milliseconds, and the ambient temperature T is equal to 22 degrees Celsius to determine that the ambient distribution time $T2_{T0}$ is equal to 361 milliseconds. In addition, the device or system can use correlations between the relaxation time distribution values and other formation properties to generate other formation property predictions. Other formation property predictions may comprise partial porosity, permeability, hydrocarbon in place, cutoff values, etc. For example, after determining that a T2GM$_{TOT}$ is equal to 350 milliseconds, the device or system can use a correlation table between T2GM and partial porosity to generate a prediction for a partial porosity value.

In some embodiments, the device or system can generate the formation property prediction based on the selected correlation model directly without first calculating a temperature-corrected NMR relaxation time distribution value. For example, the device or system can use the correlation model between a pore throat value and the geometric mean of T2 distribution values to determine temperature-corrected pore throat values based on measured pore throat values, wherein the measured pore throat values can themselves be based on measured NMR relaxation time distribution values. As another example, the device or system can use Equation (11) determine the ambient MicroCutoff value at an ambient temperature $T_0$ when the measured MicroCutoff value is MicroCutoff$_{TS}$. Once the device or system generates the one or more temperature-corrected NMR relaxation time distribution values and/or one or more temperature-corrected formation property values, operations of the flowchart 400 can be considered to be complete.

Example Data Using Dimension Reduction Operations

Figure 5:
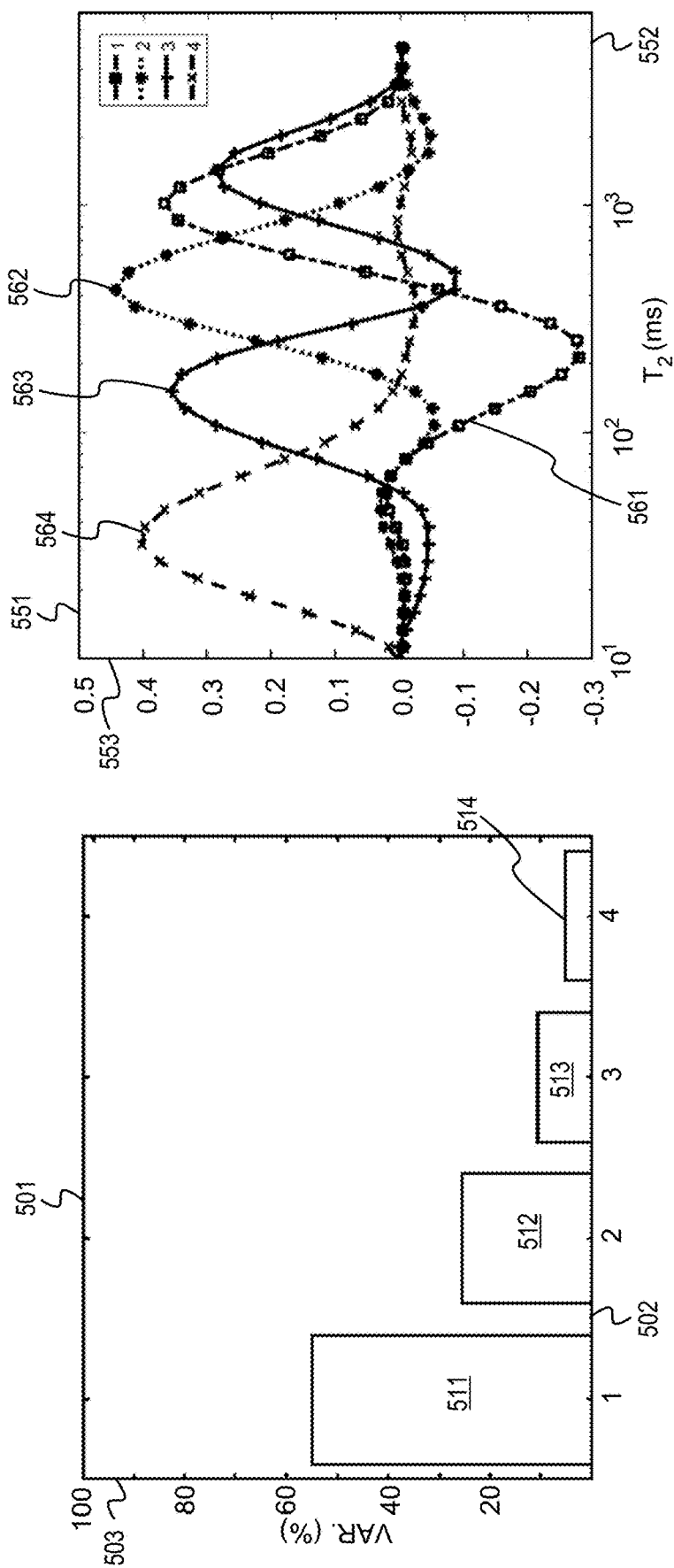
FIG. 5 includes a first plot representing a variation based on four principal components and a second plot representing the corresponding four principal components.

FIG. 5 includes a first plot representing a variation based on four principal components and a second plot representing the corresponding four principal components. FIG. 5 includes a first plot 501 and a second plot 551. The first plot 501 is a bar plot that has a horizontal axis 502 and a vertical axis 503. The horizontal axis 502 indicates a number N, wherein N components are available to fit a trend. The vertical axis 503 represents a measurement of data variance, wherein a greater data variance correlates with a reduced fit.

The first bar 511 represents the data variance when fitting a T2 distribution using a single principal component. The second bar 512 represents the data variance when fitting the T2 distribution using a sum of the fitted, weighted set of two principal components. As shown, by comparing the second bar 512 with the first bar 511, the sum of the fitted, weighted set of two principal components has less error from the actual T2 distribution compared to fitting with the single principal component. The third bar 513 represents the data variance when fitting the T2 distribution using a sum of the fitted, weighted set of three principal components. As shown, by comparing the third bar 513 with the second bar 512, the sum of the fitted, weighted set of three principal components has less error from the actual T2 distribution compared to the sum of the weighted set of two principal components. The fourth bar 514 represents the data variance when fitting the T2 distribution using a sum of the fitted, weighted set of four principal components. As shown, by comparing the fourth bar 514 with the third bar 513, the sum of the fitted, weighted set of four principal components has less error from the actual T2 distribution compared to the sum of the fitted, weighted set of three principal components.

The second plot 551 has a horizontal axis 552 and a vertical axis 553. The horizontal axis 552 indicates a reflection time length T2 in units of milliseconds along a logarithmic axis. The vertical axis 553 represents a unitless value representing coefficients of a principal component. Each of the lines 561-564 represent a principal component, wherein a weighted set of the principal component can be fitted to a particular NMR relaxation time distribution with a variance indicated by the fourth bar 514.

Figure 6:
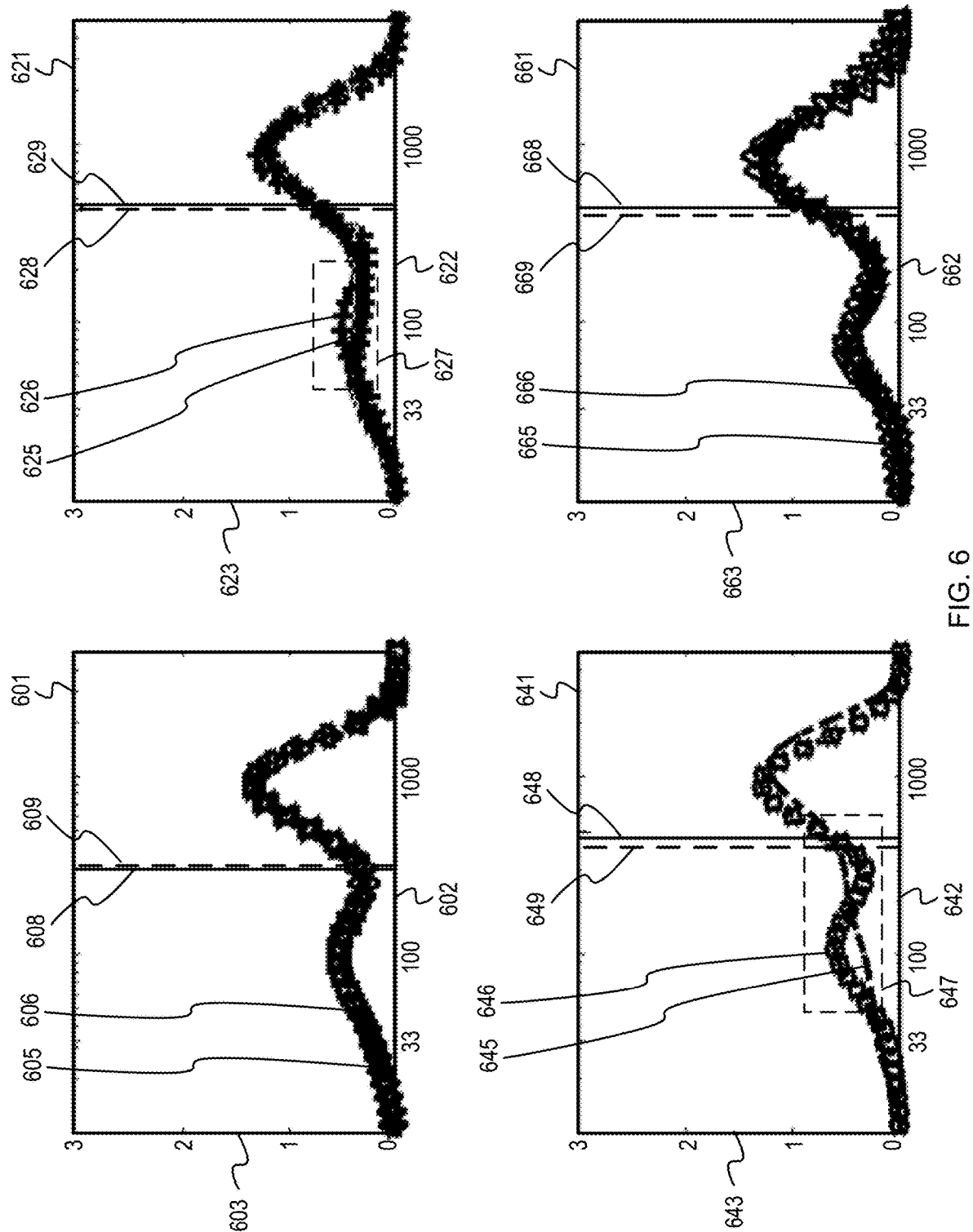
FIG. 6 includes a first set of plots representing a comparison between measured T2 distributions and reconstructed T2 distributions at various calibration temperatures for a first core sample.

FIG. 6 includes a first set of plots representing a comparison between measured T2 distributions and reconstructed T2 distributions at various calibration temperatures for a first core sample. The first plot 601 has a horizontal axis 602 and a vertical axis 603. The second plot 621 that has a horizontal axis 622 and a vertical axis 623. The third plot 641 has a horizontal axis 642 and a vertical axis 643. The fourth plot 661 has a horizontal axis 662 and a vertical axis 663. Each of the horizontal axes 602, 622, 642, and 662 represents a T2 distribution value measured in milliseconds. Each of the vertical axes 603, 623, 643, and 663 represents a T2 distribution value. Each of the datasets represented by the plots 601, 621, 641, and 661 can represent actual measurements or reconstructed measurement values corresponding to a first core sample at a calibration temperature.

The first plot 601 includes a first dataset trendline 605 represented by upward pointed triangles, wherein the individual points of the first dataset trendline 605 are measured T2 distribution values corresponding with a temperature of 22 degrees Celsius. The first plot 601 also includes a second dataset trendline 606 represented by downward pointed triangles, wherein the individual points of the second dataset trendline 606 are reconstructed T2 distribution values that are reconstructed from a weighted set of components using the operations described above for blocks 320 and 324 of FIG. 3 for a temperature of 22 degrees Celsius. As seen in the first plot 601, the measured T2 distribution values and the reconstructed T2 distribution values can have a relative difference that is less or equal to 10% of the measured T2 distribution value. For example, the difference between the datasets corresponding to each of the first dataset trendline 605 and second dataset trendline 606 can be less than 5% between 0 milliseconds and 1000 milliseconds. The first plot 601 also includes a first dataset geometric mean 608, wherein a system can apply an NMR distribution analysis method to determine the first dataset geometric mean 608 based on the T2 distribution values represented by the first dataset trendline 605. The first plot 601 also includes a second dataset geometric mean 608, wherein a system can apply the NMR distribution analysis method to determine the second dataset geometric mean 609 based on the T2 distribution values represented by the second dataset trendline 606.

The second plot 621 includes a first dataset trendline 625 as represented by the six-pointed stars, wherein the individual points of the first dataset trendline 625 are measured T2 distribution values. The second plot 621 also includes a second dataset trendline 626 as represented by the plus symbols, wherein the individual points of the second dataset trendline 626 are reconstructed T2 distribution values that are reconstructed from a weighted set of components using the operations described above for block 320 of FIG. 3. As shown in the second plot 621 in the region 627, in some embodiments, a reconstruction of the measured T2 distribution values using the weighted set of components may be inaccurate. In some embodiments, the accuracy of a reconstruction using a weighted set of components can be increased by using a greater number of components (e.g. 5 components, 10 components, 20 components, etc.). The second plot 621 also includes a second dataset geometric mean 628, wherein a system can apply an NMR distribution analysis method to determine the second geometric mean 628 based on the T2 distribution values represented by the second dataset trendline 625. The second plot 621 also includes a second dataset geometric mean 629, wherein a system can apply the NMR distribution analysis method to determine the second geometric mean 629 based on the T2 distribution values represented by the second dataset trendline 626.

The third plot 641 includes a first dataset trendline 645 as represented by the hollow six-pointed stars, wherein the individual points of the first dataset trendline 645 are measured T2 distribution values. The third plot 641 also includes a second dataset trendline 646 as represented by the dashed lines, wherein the individual dashes of the second dataset trendline 646 are reconstructed T2 distribution values that are reconstructed from a weighted set of components using the operations described above for block 320 of FIG. 3. As shown in the second plot 621 in the region 627, in some embodiments, a reconstruction of the measured T2 distribution values using the weighted set of components may be inaccurate within a subset the T2 distribution. In some embodiments, the accuracy of a reconstruction using a weighted set of components can be increased by using a greater number of components. The third plot 641 also includes a third dataset geometric mean 648, wherein a system can apply an NMR distribution analysis method to determine the third dataset geometric mean 648 based on the T2 distribution values represented by the third dataset trendline 645. The third plot 641 also includes a third dataset geometric mean 649, wherein a system can apply the NMR distribution analysis method to determine the third dataset geometric mean 649 based on the T2 distribution values represented by the third dataset trendline 646.

The fourth plot 661 includes a first dataset trendline 665 represented by upward pointed triangles, wherein the individual points of the first dataset trendline 665 are measured T2 distribution values. The first plot 661 also includes a second dataset trendline 666 represented by downward pointed triangles, wherein the individual dashes of the second dataset trendline 666 are reconstructed T2 distribution values that are reconstructed from a weighted set of components using the operations described above for block 320 of FIG. 3. As seen in the first plot 661, the measured T2 distribution values and the reconstructed T2 distribution values can have a relative difference that is less or equal to 10% of the measured T2 distribution value. For example, the difference between the datasets corresponding to each of the first dataset trendline 665 and second dataset trendline 666 can be less than 5% between 0 milliseconds and 1000 milliseconds. The fourth plot 661 also includes a fourth dataset geometric mean 668, wherein a system can apply an NMR distribution analysis method to determine the fourth dataset geometric mean 668 based on the T2 distribution values represented by the fourth dataset trendline 665. The fourth plot 661 also includes a fourth dataset geometric mean 669, wherein a system can apply the NMR distribution analysis method to determine the fourth dataset geometric mean 669 based on the T2 distribution values represented by the fourth dataset trendline 666.

Figure 7:
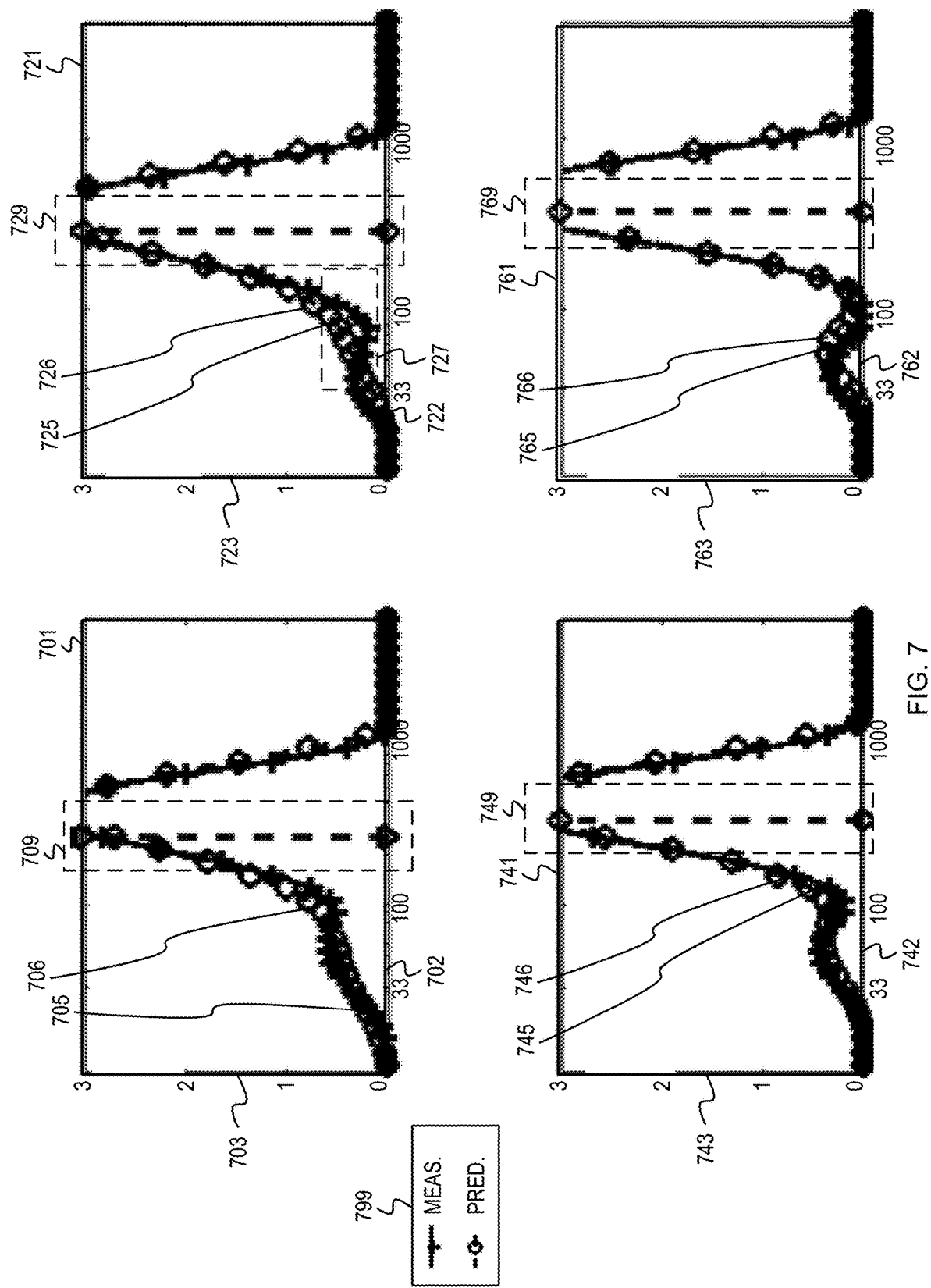
FIG. 7 includes a second set of plots representing a comparison between measured T2 distributions and reconstructed T2 distributions at various calibration temperatures for a second core sample.

FIG. 7 includes a second set of plots representing a comparison between measured T2 distributions and reconstructed T2 distributions at various calibration temperatures for a second core sample. The first plot 701 has a horizontal axis 702 and a vertical axis 703. The second plot 721 has a horizontal axis 722 and a vertical axis 723. The third plot 741 has a horizontal axis 742 and a vertical axis 743. The fourth plot 761 has a horizontal axis 762 and a vertical axis 763. Each of the horizontal axes 702, 722, 742, and 762 represents a T2 distribution value measured in milliseconds. Each of the vertical axes 703, 723, 743, and 763 represents a normalized T2 distribution value. Each of the datasets represented by the plots 701, 721, 741, and 761 can represent actual measurements or reconstructed measurement values corresponding to a second core sample, wherein the second core sample can be different from the first core sample described above for FIG. 6. A legend 799 shows that the plus symbols represent actual measured T2 distribution values and the circles represent predicted T2 distribution values.

The first plot 701 includes a first dataset trendline 705 represented by plus symbols, wherein the individual points of the first dataset trendline 705 are measured T2 distribution values. The first plot 701 also includes a second dataset trendline 726 represented by circles, wherein the individual points of the second dataset trendline 706 are reconstructed T2 distribution values that are reconstructed from a weighted set of calibration components using the operations described above for block 320 of FIG. 3. As seen in the first plot 701, the measured T2 distribution values and the reconstructed T2 distribution values can have a relative difference that is less or equal to 10% of the measured T2 distribution value. For example, the difference between the datasets corresponding to each of the first dataset trendline 705 and second dataset trendline 706 can be less than 10% between 0 milliseconds and 1000 milliseconds. In addition, the first plot 701 includes a region 709 that shows two overlapping vertical line representing the geometric mean of the measured T2 distribution values and the predicted T2 distribution values in the plot 701, wherein the overlapping state of the two vertical lines illustrate the that the measured T2 distribution values and the predicted T2 distribution values have a relative difference of less than 10%.

The second plot 721 includes a first dataset trendline 725 as represented by the plus symbols, wherein the individual points of the first dataset trendline 725 are measured T2 distribution values. The second plot 721 also includes a second dataset trendline 726 as represented by the circles, wherein the individual points of the second dataset trendline 726 are reconstructed T2 distribution values that are predicted from a weighted set of calibration components using the operations described above for block 320 of FIG. 3. As shown in the second plot 721 in the region 727, in some embodiments, a reconstruction of the measured T2 distribution values using the weighted set of calibration components may be inaccurate within a subset the T2 distribution. In some embodiments, the accuracy of a reconstruction using a weighted set of calibration components can be increased by using a greater number of components. In addition, the first plot 721 includes a region 729 that shows two overlapping vertical line representing the geometric mean of the measured T2 distribution values and the predicted T2 distribution values in the plot 721, wherein the overlapping state of the two vertical lines illustrate the that the measured T2 distribution values and the predicted T2 distribution values have a relative difference of less than 10%.

The third plot 741 includes a first dataset trendline 745 as represented by the plus symbols, wherein the individual points of the first dataset trendline 745 are measured T2 distribution values. The third plot 741 also includes a second dataset trendline 746 as represented by the circles, wherein the individual points of the second dataset trendline 766 are predicted T2 distribution values that are predicted from a weighted set of calibration components using the operations described above for block 320 of FIG. 3. As seen in the first plot 701, the measured T2 distribution values and the predicted T2 distribution values can have a relative difference that is less or equal to 10% of the measured T2 distribution value. In addition, the first plot 741 includes a region 749 that shows two overlapping vertical line representing the geometric mean of the measured T2 distribution values and the predicted T2 distribution values in the plot 741, wherein the overlapping state of the two vertical lines illustrate the that the measured T2 distribution values and the predicted T2 distribution values have a relative difference of less than 10%.

The fourth plot 761 includes a first dataset trendline 765 represented by plus symbols, wherein the individual points of the first dataset trendline 765 are measured T2 distribution values. The first plot 761 also includes a second dataset trendline 766 represented by circles, wherein the individual points of the second dataset trendline 766 are reconstructed T2 distribution values that are reconstructed from a weighted set of calibration components using the operations described above for block 320 of FIG. 3. As seen in the first plot 761, the measured T2 distribution values and the reconstructed T2 distribution values can have a relative difference that is less or equal to 10% of the measured T2 distribution value. In addition, the first plot 761 includes a region 769 that shows two overlapping vertical line representing the geometric mean of the measured T2 distribution values and the predicted T2 distribution values in the plot 761, wherein the overlapping state of the two vertical lines illustrate the that the measured T2 distribution values and the predicted T2 distribution values have a relative difference of less than 10%.

Figure 8:
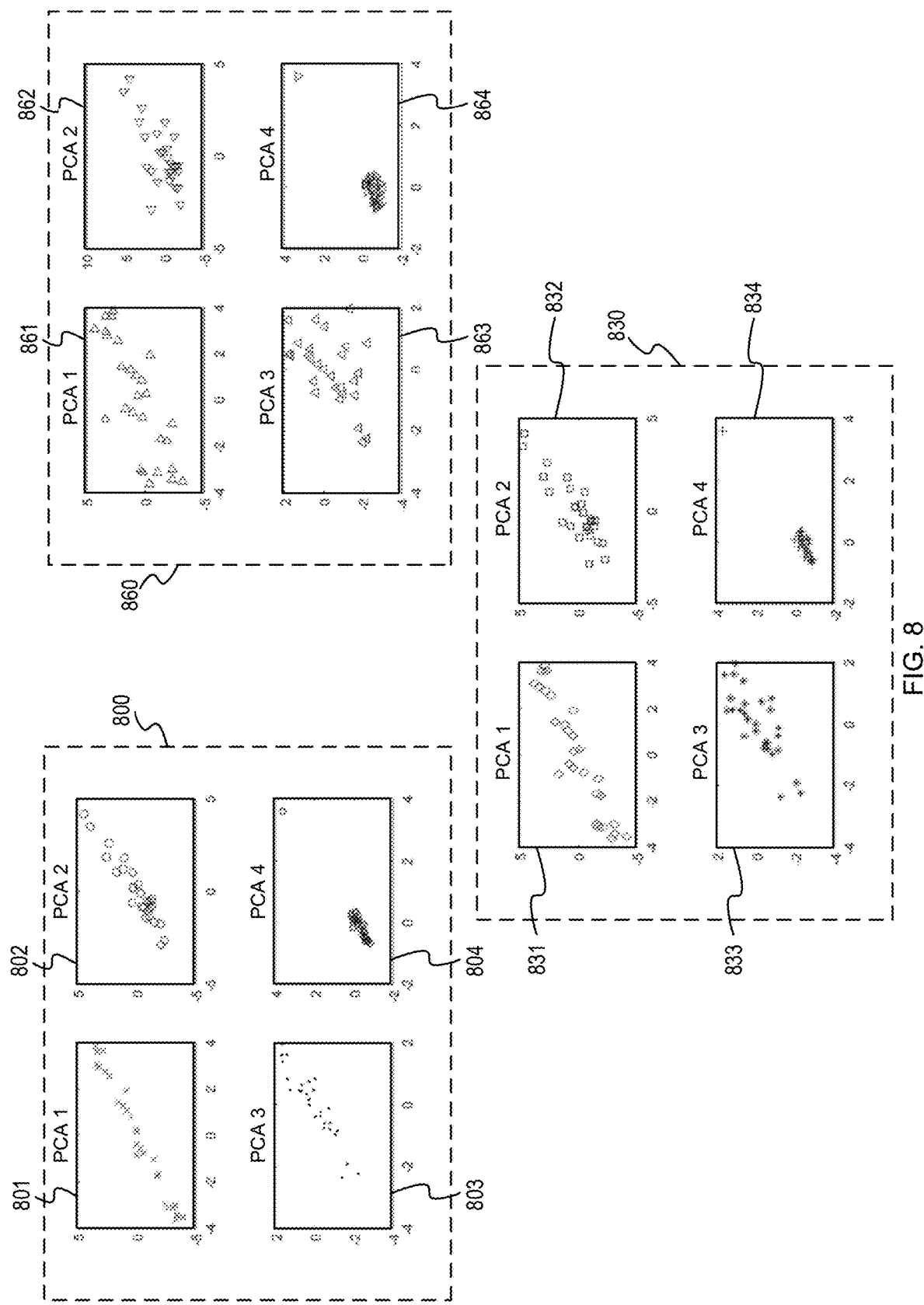
FIG. 8 includes a set of plots representing a correlation between principal component coefficients at different temperatures.

FIG. 8 includes a set of plots representing a correlation between principal component coefficients at different temperatures. Each of the horizontal axes in each of the sets of plots 800, 830 and 860 represent coefficient values of a principal component determined at 22 degrees Celsius. Each of the vertical axes in the first set of plots 800 represent coefficient values of a principal component determined at 46 degrees Celsius. Each of the vertical axes in the second set of plots 830 represent coefficient values of a principal component determined at 66 degrees Celsius. Each of the vertical axes in the first set of plots 800 represent coefficient values of a principal component determined at 92 degrees Celsius.

A first set of four plots 800 shows the correlation between principal components resulting from a set of dimension-reduction operations performed at two different sample temperatures. Each of the points in the first correlation plot 801, second correlation plot 802, third correlation plot 803, and fourth correlation plot 804 represent a correlation between a coefficient for a principal component at 22 degrees Celsius (horizontal axis) and a coefficient for the same principal component at 46 degrees (vertical axis) Celsius. Each of the correlation plots 801-804 show that the relationship between principal component coefficients can be approximated as linear relationships with respect to temperature.

A second set of four plots 830 shows the correlation between principal components resulting from a set of dimension-reduction operations performed at two different sample temperatures. Each of the points in the fifth correlation plot 831, sixth correlation plot 832, seventh correlation plot 833, and eighth correlation plot 834 represent a correlation between a coefficient of a principal component at 22 degrees Celsius (horizontal axis) and a coefficient of the same principal component at 66 degrees Celsius (vertical axis). Each of the correlation plots 831-834 show that the relationship between principal component coefficients can be approximated as linear relationships with respect to temperature.

A third set of four plots 860 shows the correlation between principal components resulting from a set of dimension-reduction operations performed at two different sample temperatures. Each of the points in the ninth correlation plot 861, tenth correlation plot 862, eleventh correlation plot 863, and twelfth correlation plot 864 represent a correlation between a coefficient of a principal component at 22 degrees Celsius (horizontal axis) and a coefficient of the same principal component at 92 degrees Celsius (vertical axis). Each of the correlation plots 861-864 show that the relationship between principal component coefficients can be approximated as linear relationships with respect to temperature.

Figure 9:
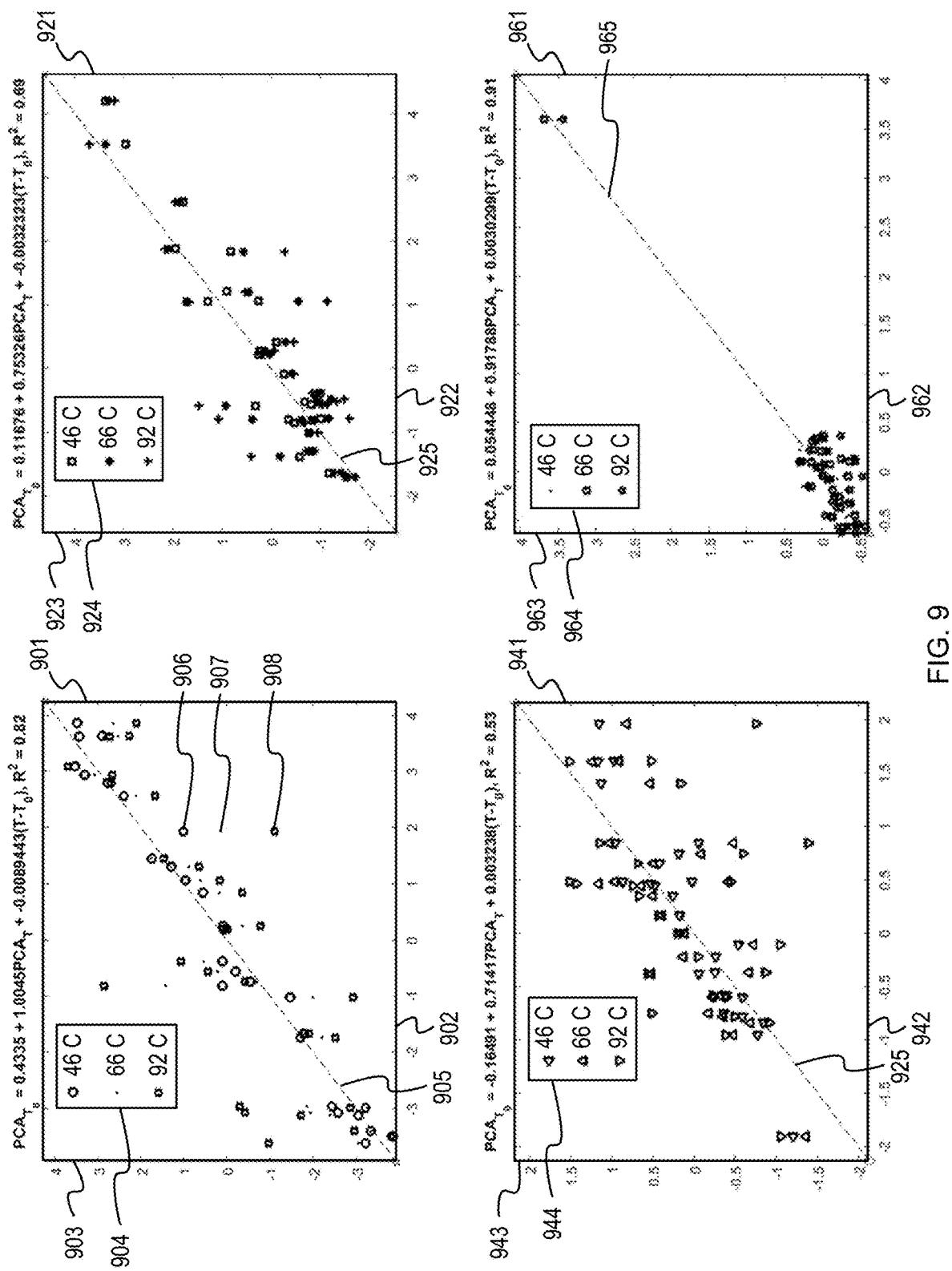
FIG. 9 includes a set of plots representing a comparison between principal component coefficients at different temperatures.

FIG. 9 includes a set of plots representing a comparison between principal component coefficients at different temperatures. A first plot 901 has a horizontal axis 902 and a vertical axis 903. A second plot 921 has a horizontal axis 922 and a vertical axis 923. A third plot 941 has a horizontal axis 942 and a vertical axis 943. A fourth plot 961 has a horizontal axis 962 and a vertical axis 963. Each of the horizontal axes 902, 922, 942, and 962 represents a coefficient value of a measured principal component in dimensionless units. Each of the vertical axes 903, 923, 943, and 963 represents a coefficient value of a temperature-corrected principal component in dimensionless units generated by the operations described above for block 324 of FIG. 3. Put another way, each of data points in the first plot 901, second plot 921, third plot 941, and fourth plot 961 show a comparison between a measured principal component value and a temperature-corrected principal component value corresponding to the same temperature, wherein the temperature-corrected principal component are corrected using Equations (13)-(16), respectively. As shown in FIG. 9, the data in the first plot 901, second plot 921, third plot 941 and fourth plot 961 show coefficient of determination ("R2" or "$R^2$") values of 0.82, 0.69, 0.53, and 0.91 respectively.

The first plot 901 includes a first dataset including values that come from the 46 degrees Celsius comparisons, 66 degrees Celsius comparisons and 92 degrees Celsius comparisons. The first plot 901 includes a legend 904 that shows which of the data points are included in these respective datasets. For example, all of the circular points on the first plot 901 represent data included in the 92 degrees Celsius system. As shown from the data points in the first plot 901, a correlation line 905 can be generated, wherein a slope of "1.0" on the correlation line 905 represents an equality relationship between the predicted value and the actual measured value. Thus, if the value of the correlation line 905 is equal to the value of a data point for a particular principal component coefficient value (e.g. a data point falls on the correlation line 905 at the particular principal component coefficient value), the data point represents a relationship wherein the principal component coefficient value predicted for a target temperature using the operations of the flowchart 300 is equal to the actual principal component coefficient value measured at the target temperature.

The relatively high correlation between the various data points at their corresponding calibration temperatures suggest that the predicted principal component coefficient values can be similar to or interchanged with the actual corresponding principal component coefficient values. In some embodiments, the difference between a predicted value and an actual measured value can increase with respect to temperature. For example, the data point 906 corresponds with the 46 degrees Celsius temperature, a data point 907 corresponds with the 66 degrees Celsius temperature and a data point 908 corresponds with the 92 degrees Celsius temperature, wherein the data point 906 is closer to the correlation line 905 than the data point 907, and the data point 907 is closer to the correlation 905 than the data point 908.

The second plot 921 includes a second dataset including values that come from the 46 degrees Celsius comparisons, 66 degrees Celsius comparisons and 92 degrees Celsius comparisons. The second plot 921 includes a legend 924 that shows which of the data points are included in these respective datasets. For example, all of the square points on the second plot 921 represent data included in the 92 degrees Celsius system. As shown from the data points in the second plot 921, a correlation line 925 can be generated, wherein the correlation line 925 represents an equality relationship between the predicted value and the actual measured value. Thus, if the value of the correlation line 925 is equal to the value of a data point for a particular principal component coefficient value (e.g. a data point falls on the correlation line 925 at the particular principal component coefficient value), the data point represents a relationship wherein the principal component coefficient value predicted for a target temperature using the operations of the flowchart 300 is equal to the actual principal component coefficient value measured at the target temperature.

The third plot 941 includes a third dataset including values that come from the 46 degrees Celsius comparisons, 66 degrees Celsius comparisons and 92 degrees Celsius comparisons. The third plot 941 includes a legend 944 that shows which of the data points are included in these their respective datasets. For example, all of the downward-pointing triangular points on the third plot 941 represent data included in the 92 degrees Celsius system. As shown from the data points in the third plot 941, a correlation line 945 can be generated, wherein the correlation line 945 represents an equality relationship between the predicted value and the actual measured value. Thus, if the value of the correlation line 945 is equal to the value of a data point for a particular principal component coefficient value (e.g. a data point falls on the correlation line 945 at the particular principal component coefficient value), the data point represents a relationship wherein the principal component coefficient value predicted for a target temperature using the operations of the flowchart 300 is equal to the actual principal component coefficient value measured at the target temperature.

The fourth plot 961 includes a fourth dataset including values that come from the 46 degrees Celsius comparisons, 66 degrees Celsius comparisons and 92 degrees Celsius comparisons. The fourth plot 961 includes a legend 964 that shows which of the data points are included in these respective datasets. For example, all of the star points on the fourth plot 961 represent data included in the 92 degrees Celsius system. As shown from the data points in the fourth plot 961, a correlation line 965 can be generated, wherein the correlation line 965 represents an equality relationship between the predicted value and the actual measured value. Thus, if the value of the correlation line 965 is equal to the value of a data point for a particular principal component coefficient value (e.g. a data point falls on the correlation line 965 at the particular principal component coefficient value), the data point represents a relationship wherein the principal component coefficient value predicted for a target temperature using the operations of the flowchart 300 is equal to the actual principal component coefficient value measured at the target temperature.

Figure 10:
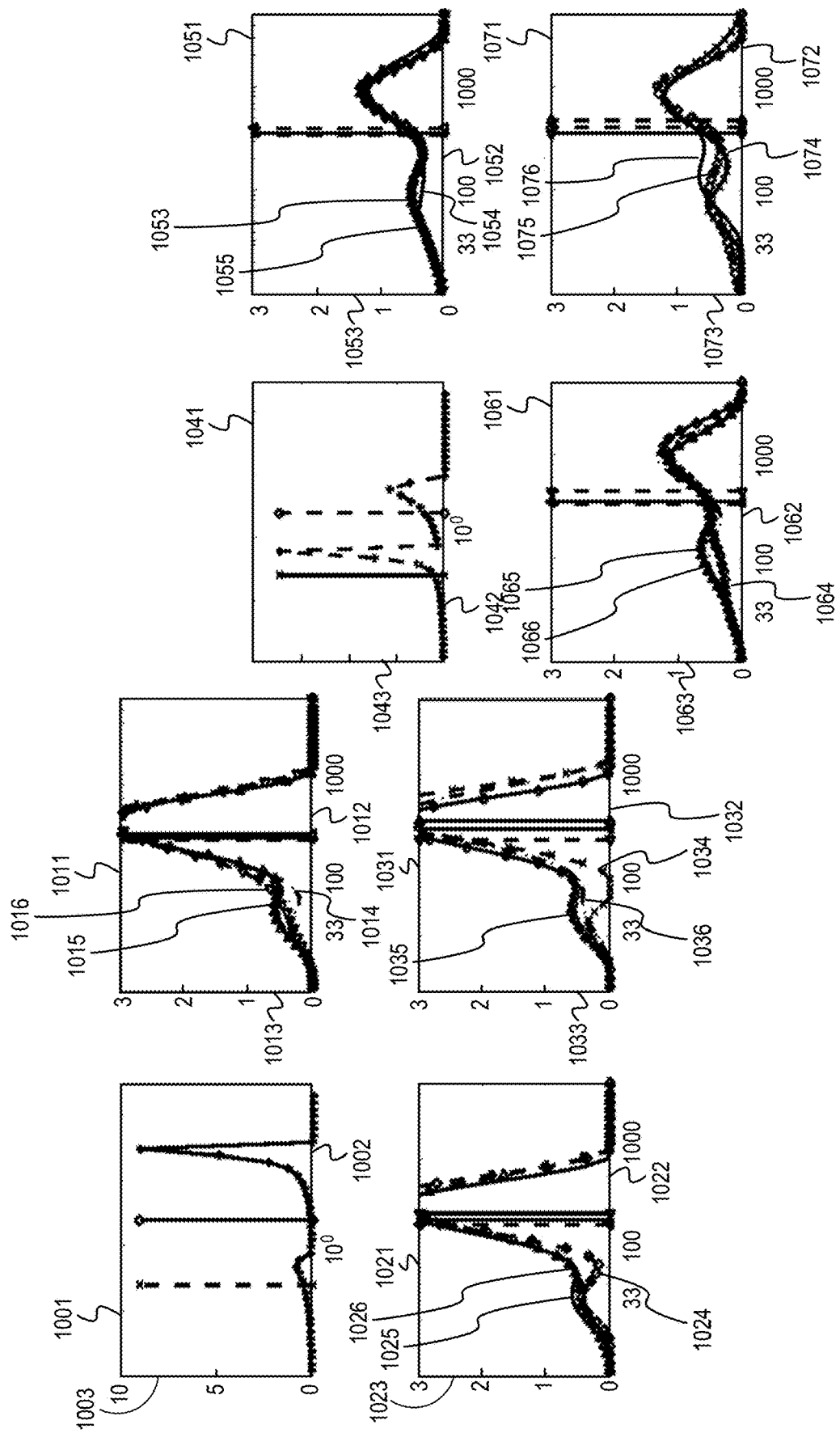
FIG. 10 includes a set of plots illustrating a comparison of measured T2 distributions and predicted T2 distributions for two different core samples.

FIG. 10 includes a set of plots illustrating a comparison of measured T2 distributions and predicted T2 distributions for two different core samples. A first plot 1001 has a horizontal axis 1002 and a vertical axis 1003. The first plot 1001 represents a pore throat size distribution for a first core sample. The horizontal axis 1002 represents a measurement of pore throat size in units of microns. The vertical axis 1003 represents a relative amount (with to a unitless constant) of pore throats at their corresponding pore throat sizes. The fifth plot 1041 has a horizontal axis 1042 and a vertical axis 1043. A fifth plot 1041 represents a pore throat size distribution for a second core sample. The horizontal axis 1042 represents a measurement of pore throat size in units of microns. The vertical axis 1043 represents a relative amount (with to a unitless constant) of pore throats at the corresponding pore throat size.

The second plot 1011 has a horizontal axis 1012 and a vertical axis 1013. The third plot 1021 has a horizontal axis 1022 and a vertical axis 1023. The fourth plot 1031 has a horizontal axis 1032 and a vertical axis 1033. Each of the second plot 1011, third plot 1021 and fourth plot 1031 are based on measurements from the first core sample and include both actual measurements of a sample at a sample temperature of 22 degrees Celsius predicted measurements of a sample corresponding with a target temperature of 22 degrees Celsius. The second plot 1011 also includes measured values corresponding with a temperature of 46 degrees Celsius. The third plot 1021 also includes values corresponding with 66 degrees Celsius. The fourth plot 1031 also includes values corresponding with 92 degrees Celsius. Each of the horizontal axes 1012, 1022 and 1032 represents measured and predicted values of T2 distribution values in milliseconds. Each of the vertical axes represents a relative amount (with to a unitless constant) of T2 measurements at the corresponding T2 distribution value.

The trendline 1014 represents T2 distribution values measured at a sample temperature of 46 degrees Celsius. The trendline 1015 represents T2 distribution values measured at a target temperature of 22 degrees Celsius. The trendline 1016 represents T2 distribution values predicted to correspond with the target temperature using operations from the flowchart 300 of FIG. 3. As can be seen, the predicted T2 distribution values for the target temperature can be different from measured T2 distribution values at the target temperature. However, the predicted T2 distribution values for the target temperature can show greater quantitative similarity to the measured T2 distribution values than the measured T2 distribution values corresponding to a different temperature, wherein quantitative similarity can be measured as a relative difference with respect to the measured T2 value at the target temperature. This greater quantitative similarity indicates the accuracy of the predicted T2 distribution values.

The trendline 1024 represents T2 distribution values measured at a sample temperature of 66 degrees Celsius. The trendline 1025 represents T2 distribution values measured at a target temperature of 22 degrees Celsius. The trendline 1026 represents T2 distribution values predicted to correspond with the target temperature using operations from the flowchart 300 of FIG. 3. As was the case for the prior trendline, the predicted T2 distribution values for the trendline 1024 and the target temperature can show a strong quantitative similarity with respect to the measured T2 distribution values for the target temperature compared to a quantitative similarity value between the measured T2 distribution values for a different temperature.

The trendline 1034 represents T2 distribution values measured at a sample temperature of 92 degrees Celsius. The trendline 1035 represents T2 distribution values measured at a target temperature of 22 degrees Celsius. The trendline 1036 represents T2 distribution values predicted to correspond with the target temperature using operations from the flowchart 300 of FIG. 3. Again, as was the case for the prior trendline, the T2 distribution values for the trendline 1034 and the target temperature can show a strong quantitative similarity with respect to the measured T2 distribution values for the target temperature compared to a quantitative similarity value between the measured T2 distribution values for a different temperature.

The sixth plot 1051 has a horizontal axis 1052 and a vertical axis 1053. The seventh plot 1061 has a horizontal axis 1062 and a vertical axis 1063. The eighth plot 1071 has a horizontal axis 1072 and a vertical axis 1073. Each of the sixth plot 1051, seventh plot 1061 and eighth plot 1071 are based on measurements from the second core sample and include both actual measurements of the second core sample at a sample temperature of 22 degrees Celsius and predicted measurements of the second core sample corresponding with a target temperature of 22 degrees Celsius. The sixth plot 1051 also includes measurement values corresponding with a temperature of 46 degrees Celsius. The seventh plot 1061 also includes measurement values corresponding with 66 degrees Celsius. The eighth plot 1071 also includes measurement values corresponding with 92 degrees Celsius. Each of the horizontal axes 1052, 1062 and 1072 represents measured and predicted values of T2 distribution values in milliseconds. Each of the vertical axes represents a relative amount (with to a unitless constant) of T2 measurements at the corresponding T2 distribution value.

The trendline 1054 represents T2 distribution values measured at a sample temperature of 46 degrees Celsius. The trendline 1055 represents T2 distribution values measured at a target temperature of 22 degrees Celsius. The trendline 1056 represents T2 distribution values predicted to correspond with the target temperature using operations from the flowchart 300 of FIG. 3. The predicted T2 distribution values for the target temperature can show a strong quantitative similarity with respect to the measured T2 distribution values for the target temperature compared to a quantitative similarity value between the measured T2 distribution values for a different temperature.

The trendline 1064 represents T2 distribution values measured at a sample temperature of 66 degrees Celsius. The trendline 1065 represents T2 distribution values measured at a target temperature of 22 degrees Celsius. The trendline 1066 represents T2 distribution values predicted to correspond with the target temperature using operations from the flowchart 300 of FIG. 3. As can be seen, the predicted T2 distribution values for the target temperature can be different from measured T2 distribution values at the target temperature. However, the predicted T2 distribution values for the target temperature can have a greater similarity to the measured T2 distribution values for the target temperature compared to the measured T2 distribution values for the sample temperature.

The trendline 1074 represents T2 distribution values measured at a sample temperature of 92 degrees Celsius. The trendline 1075 represents T2 distribution values measured at a target temperature of 22 degrees Celsius. The trendline 1076 represents T2 distribution values predicted to correspond with the target temperature using operations from the flowchart 300 of FIG. 3. As can be seen, the predicted T2 distribution values for the target temperature can be different from measured T2 distribution values at the target temperature. However, the predicted T2 distribution values for the target temperature can have a greater similarity to the measured T2 distribution values for the target temperature than the measured T2 distribution values corresponding to the sample temperature.

Figure 11:
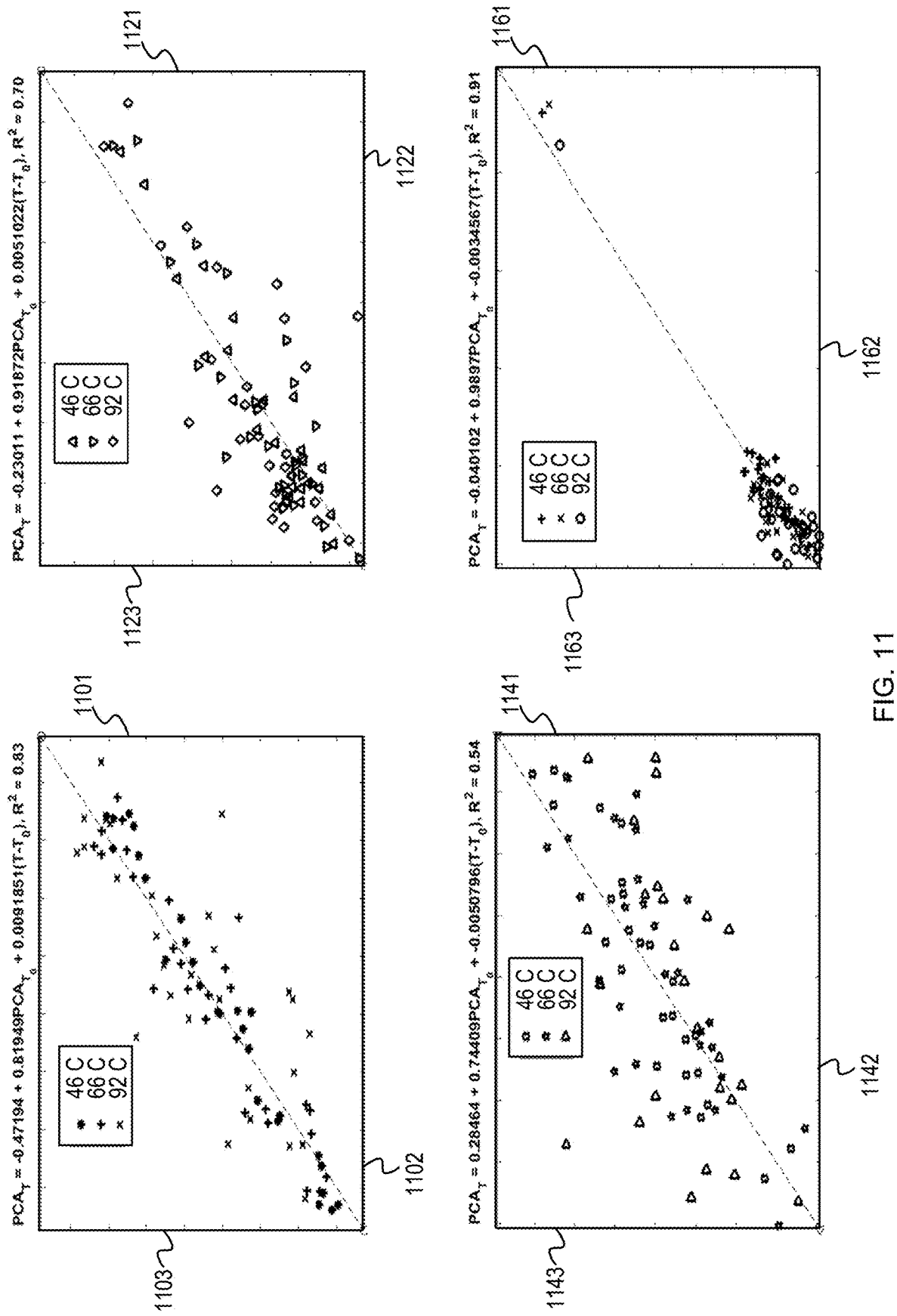
FIG. 11 includes a second set of plots representing a combined comparison between principal components at different temperatures.

FIG. 11 includes a second set of plots representing a combined comparison between principal components at different temperatures. The first plot 1101 represents a first principal component coefficient and has a horizontal axis 1102 and a vertical axis 1103. The second plot 1121 represents a second principal component coefficient and has a horizontal axis 1122 and a vertical axis 1123. The third plot 1141 represents a third principal component coefficient and has a horizontal axis 1142 and a vertical axis 1143. The fourth plot 1161 represents a fourth principal component coefficient and has a horizontal axis 1162 and a vertical axis 1163. Each of the horizontal axes 1102, 1122, 1142 and 1162 represents a PCA coefficient value as determined from a measured value. Each of the vertical axes 1103, 1123, 1143 and 1163 represents a PCA coefficient value as predicted using operations from the flowchart 300 of FIG. 3. Each of the data points can be generated using a dimension-reduced model as described above in the operations described for flowchart 300 of FIG. 3. As shown in FIG. 11, the R2 values suggest that there is a correlation between temperature and the principal component coefficients.

Figure 12:
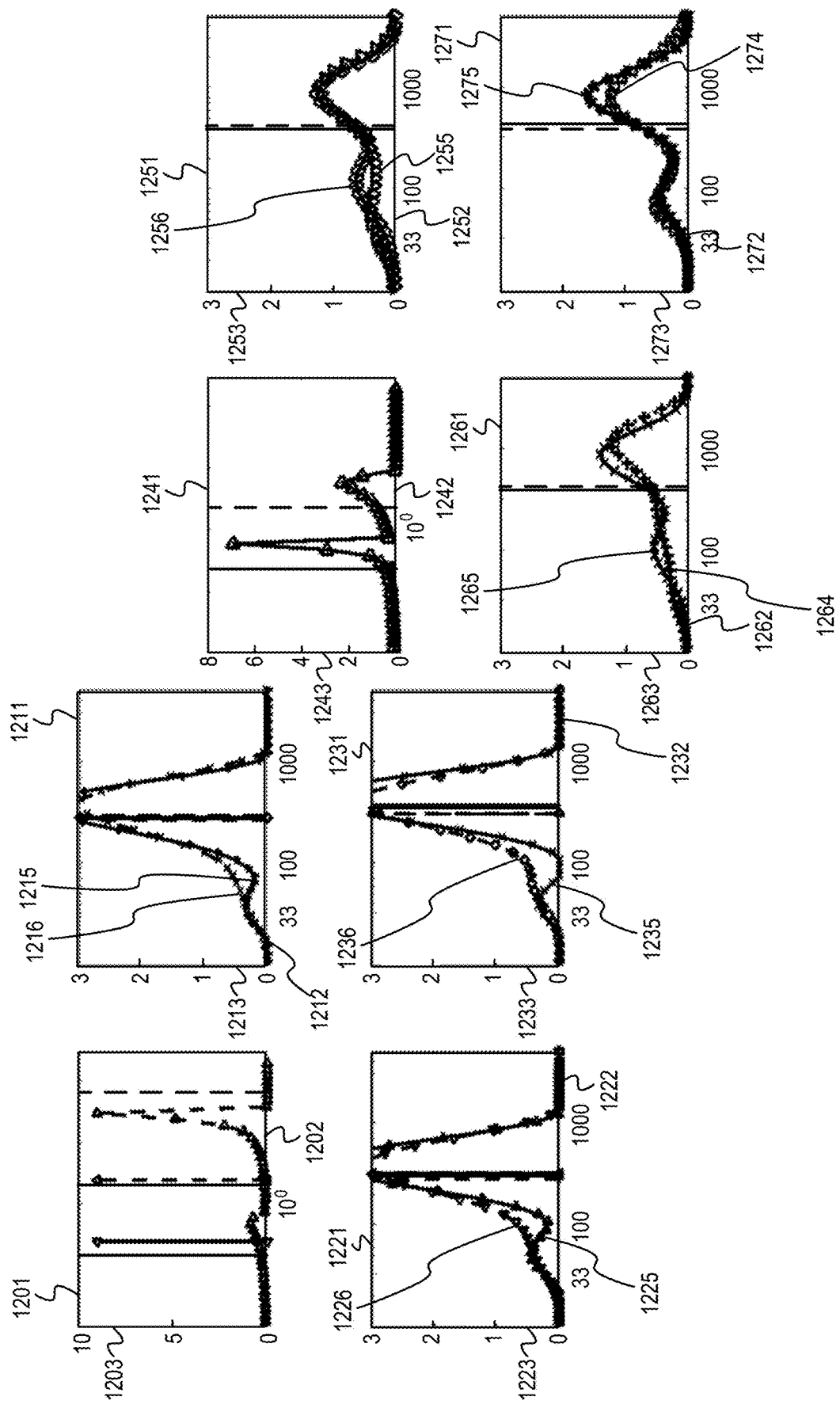
FIG. 12 includes a third set of plots representing a comparison between a measured T2 distribution and a reconstructed T2 distribution at various calibration temperatures for two samples.

FIG. 12 includes a third set of plots representing a comparison between a measured T2 distribution and a reconstructed T2 distribution at various calibration temperatures for two samples. A first plot 1201 has a horizontal axis 1202 and a vertical axis 1203. The first plot 1201 represents a pore throat size distribution for a first sample. The horizontal axis 1202 represents a measurement of pore throat size in units of microns. The vertical axis 1203 represents a relative amount (with respect to a unitless constant) of pore throats at a corresponding pore throat size. A fifth plot 1241 has a horizontal axis 1242 and a vertical axis 1243. The fifth plot 1241 represents a pore throat size distribution for a second sample. The horizontal axis 1242 represents a measurement of pore throat size in units of microns. The vertical axis 1243 represents a relative amount (with respect to a unitless constant) of pore throats at the corresponding pore throat size.

Using the operations described above for block 312 of FIG. 3, a system can generate a dimension-reduced model comprising four individual coefficient correlations represented by Equations (11)-(14), wherein $T_S$ is a sample temperature at which an NMR measurement occurs, $T_T$ is a target temperature for which the temperature-corrected principal component is to be calculated, $PCA_{T,i}$ is the i-th PCA at the target temperature $T_T$, and $PCA_{S,i}$ is the i-th principal component at the sample temperature $T_S$:

$$PCA_{T,1} = -0.47194 + 0.81949 PCA_{S,1} - 0.0091851(T_S - T_T) \quad (11)$$

$$PCA_{T,2} = -0.23011 + 0.91872 PCA_{S,2} - 0.0051022(T_S - T_T) \quad (12)$$

$$PCA_{T,3} = -0.28464 + 0.74409 PCA_{S,3} - 0.0050796(T_S - T_T) \quad (13)$$

$$PCA_{T,4} = 0.040102 + 0.9897 PCA_{S,4} - 0.0034567(T_S - T_T) \quad (14)$$

The second plot 1211 has a horizontal axis 1212 and a vertical axis 1213. The third plot 1221 has a horizontal axis 1222 and a vertical axis 1223. The fourth plot 1231 has a horizontal axis 1232 and a vertical axis 1233. Each of the horizontal axes 1212, 1222 and 1232 represents measured and predicted values of T2 distribution values in milliseconds. Each of the vertical axes represents a relative amount (with to a unitless constant) of T2 measurements at the corresponding T2 distribution value.

The trendline 1215 represents T2 distribution values measured at a target temperature of 22 degrees Celsius. The trendline 1216 represents T2 distribution values predicted to correspond with the target temperature using operations from the flowchart 300 of FIG. 3 based on measurements made at a sample temperature of 46 degrees Celsius. As can be seen, the predicted T2 distribution values for the target temperature can be similar to the measured T2 distribution values at the target temperature.

The trendline 1225 represents T2 distribution values measured at a target temperature of 22 degrees Celsius. The trendline 1226 represents T2 distribution values predicted to correspond with the target temperature using operations from the flowchart 300 of FIG. 3 based on measurements made at a sample temperature of 66 degrees Celsius. As can be seen, the predicted T2 distribution values for the target temperature can be similar to the measured T2 distribution values at the target temperature.

The trendline 1235 represents T2 distribution values measured at a target temperature of 22 degrees Celsius. The trendline 1236 represents T2 distribution values predicted to correspond with the target temperature using operations from the flowchart 300 of FIG. 3 based on measurements made at a sample temperature of 92 degrees Celsius. As can be seen, the predicted T2 distribution values for the target temperature can be different from measured T2 distribution values at the target temperature. However, the predicted T2 distribution values for the target temperature can be significantly more similar to the measured T2 distribution values than the measured T2 distribution values corresponding to a different temperature.

The sixth plot 1251 has a horizontal axis 1252 and a vertical axis 1253. The seventh plot 1261 has a horizontal axis 1262 and a vertical axis 1263. The eighth plot 1271 has a horizontal axis 1272 and a vertical axis 1273. Each of the horizontal axes 1252, 1262 and 1272 represents measured and predicted values of T2 distribution values in milliseconds. Each of the vertical axes represents a relative amount (with to a unitless constant) of T2 measurements at the corresponding T2 distribution value.

The trendline 1255 represents T2 distribution values measured at a target temperature of 22 degrees Celsius. The trendline 1256 represents T2 distribution values predicted to correspond with the target temperature using operations from the flowchart 300 of FIG. 3 based on measurements made at a sample temperature of 46 degrees Celsius. As can be seen, the predicted T2 distribution values for the target temperature can be similar to measured T2 distribution values at the target temperature for a range of T2 distribution values.

The trendline 1264 represents T2 distribution values measured at a sample temperature of 66 degrees Celsius. The trendline 1265 represents T2 distribution values measured at a target temperature of 22 degrees Celsius. The trendline 1266 represents T2 distribution values predicted to correspond with the target temperature using operations from the flowchart 300 of FIG. 3. As can be seen, the predicted T2 distribution values for the target temperature can be different from measured T2 distribution values at the target temperature. However, the predicted T2 distribution values for the target temperature can have a greater similarity to the measured T2 distribution values than the measured T2 distribution values corresponding to a different temperature.

The trendline 1274 represents T2 distribution values measured at a sample temperature of 92 degrees Celsius. The trendline 1275 represents T2 distribution values measured at a target temperature of 22 degrees Celsius. The trendline 1276 represents T2 distribution values predicted to correspond with the target temperature using operations from the flowchart 300 of FIG. 3. As can be seen, the predicted T2 distribution values for the target temperature can be different from measured T2 distribution values at the target temperature. However, the predicted T2 distribution values for the target temperature can be significantly more similar to the measured T2 distribution values than the measured T2 distribution values corresponding to a different temperature.

Example Data Using Parameter-Correlation Operations

Figure 13:
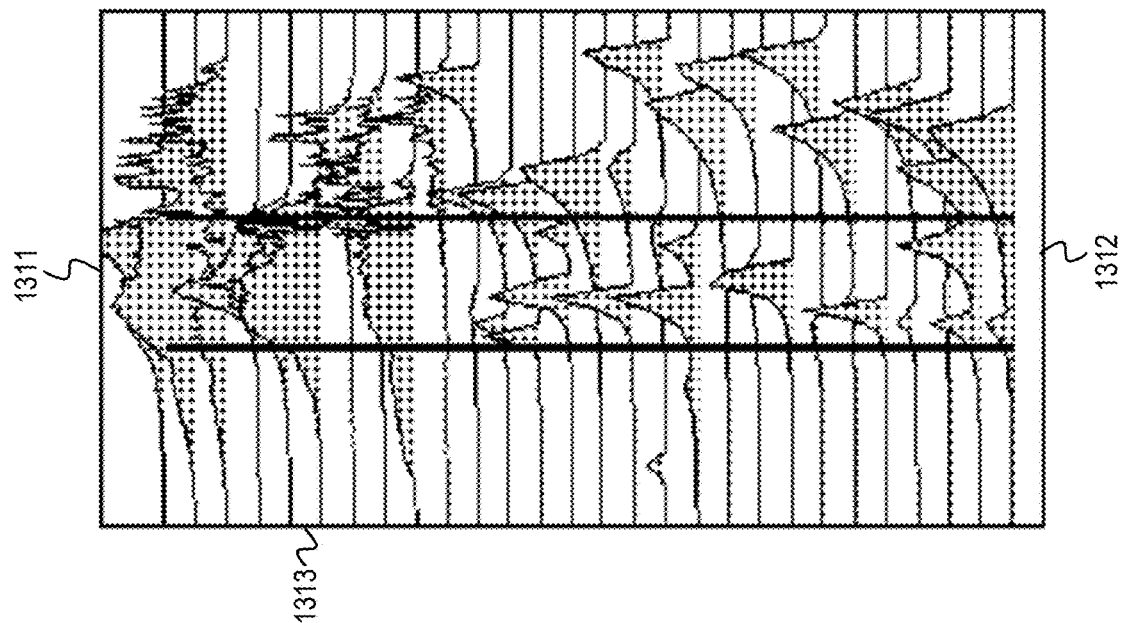
FIG. 13 shows a comparison of a T2 distribution and a pore throat distribution.
Figure 13:
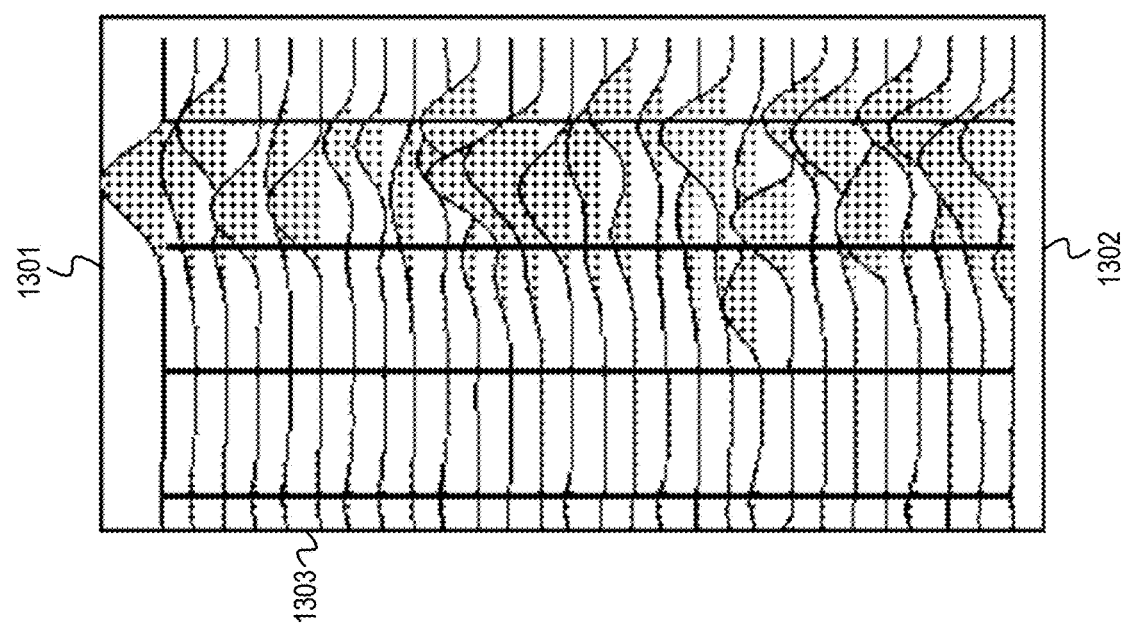

FIG. 13 shows a comparison of a T2 distribution and a pore throat distribution. The plot 1301 includes a set of overlaid T2 distribution plots having a horizontal axis 1302 and a vertical axis 1303. The horizontal axis 1302 represents T2 distribution values in units of milliseconds. The vertical axis is divided by a set of overlaid unitless distributions values. The plot 1311 includes a set of overlaid pore throat size distribution plots having a horizontal axis 1312 and a vertical axis 1313. The horizontal axis 1312 represents pore throat radius measurements in units of microns. The vertical is divided by are a set of overlaid unitless distribution plots. As can be seen in the set of overlaid plots, in some embodiments, the relationship between T2 distributions and pore throat size can be nonlinear, which can increase the inaccuracy of models based on linear correlations between pore throat size and T2 distributions.

Figure 14:
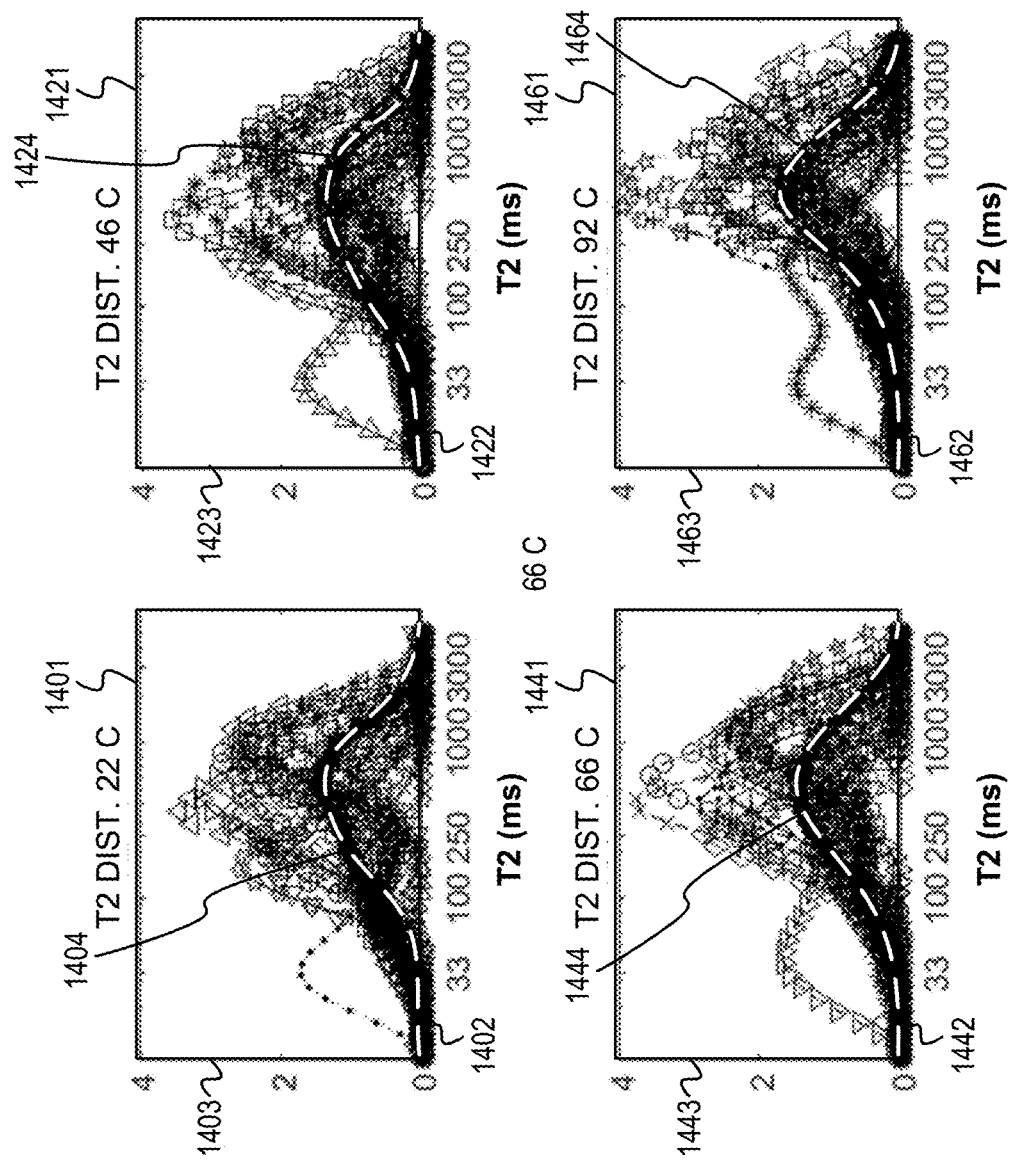
FIG. 14 shows a set of plots of T2 measurements at various temperatures.

FIG. 14 shows a set of plots of T2 measurements at various temperatures. The first plot 1401 has a horizontal axis 1402 and a vertical axis 1403. The second plot 1421 has a horizontal axis 1422 and a vertical axis 1423. The third plot 1441 has a horizontal axis 1442 and a vertical axis 1443. The fourth plot 1461 has a horizontal axis 1462 and a vertical axis 1463. Each of the horizontal axes 1402, 1422, 1442 and 1462 represents a T2 distribution value in units of milliseconds. Each of the vertical axes 1403, 1423, 1443 and 1463 represents a dimensionless distribution value. The dashed white trendlines 1404, 1424, 1444, and 1464 represents the mean distributions for 22 degrees Celsius, 46 degrees Celsius, 66 degrees Celsius and 92 degrees Celsius.

Figure 15:
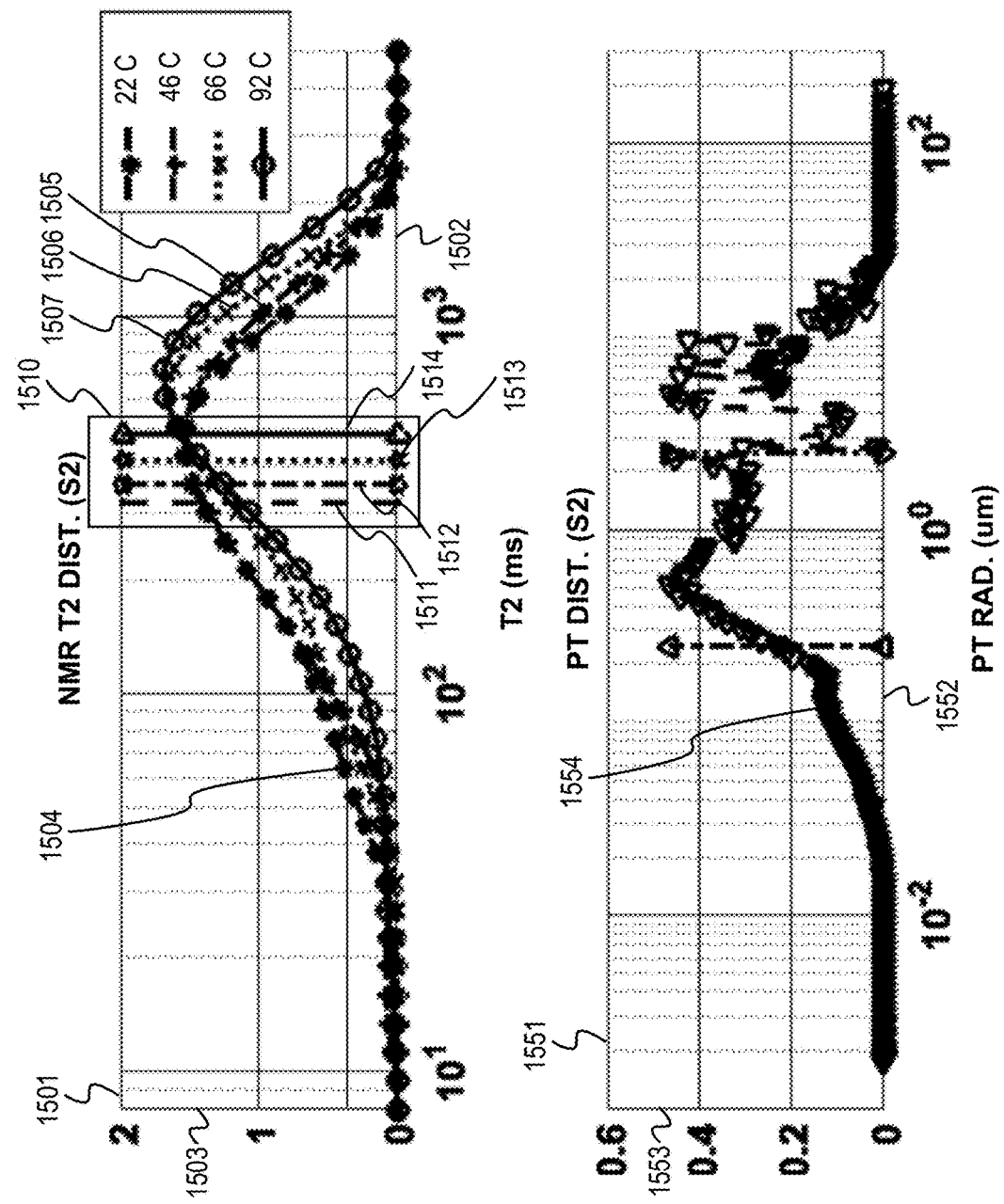
FIG. 15 shows a set of NMR T2 distribution measurements compared to pore throat size distributions.

FIG. 15 shows a set of NMR T2 distribution measurements compared to pore throat size distributions. The first plot 1501 has a horizontal axis 1502 and a vertical axis 1503. The horizontal axis 1502 represents T2 distribution values in milliseconds. The vertical axis 1503 represents a dimensionless distribution value corresponding with the T2 distribution values. The trendline 1504 represents the T2 distribution values at 22 degrees Celsius. The trendline 1505 represents the T2 distribution values at 46 degrees Celsius. The trendline 1506 represents the T2 distribution values at 66 degrees Celsius. The trendline 1507 represents the T2 distribution values at 92 degrees Celsius. As shown in FIG. 15, the T2 distribution values for T2 distribution values greater than approximately 500 milliseconds can have different temperature trends compared to T2 distribution values for T2 distribution values less than approximately 500 milliseconds.

In addition, the plot 1501 includes a boxed region 1510. The boxed region 1510 includes a first vertical line 1511, a second vertical line 1512, a third vertical line 1513, and a fourth vertical line 1514. The first vertical line 1511 indicates the value of the geometric mean of the T2 distribution ("$T2_{GM}$") corresponding to 22 degrees Celsius. The second vertical line 1512 indicates the value of the geometric mean of the T2 distribution corresponding to 46 degrees Celsius. The third vertical line 1513 indicates the value of the geometric mean of the T2 distribution corresponding to 66 degrees Celsius. The fourth vertical line 1514 indicates the value of the geometric mean of the T2 distribution corresponding to 92 degrees Celsius. The vertical lines 1511-1514 are sequentially positioned in an increasing direction on the plot 1501, which can suggest that the corresponding geometric means of the T2 distributions for 22 degrees Celsius, 46 degrees Celsius, 66 degrees Celsius, and 92 degrees Celsius are also monotonically increasing. Thus, as shown in the plot 1501, values based on the T2 distributions such as $T2_{GM}$ can be directly correlated with temperature.

The second plot 1551 has a horizontal axis 1552 and a vertical axis 1553. The horizontal axis 1552 represents pore throat size in microns. The vertical axis 1553 represents a dimensionless distribution value corresponding with the pore throat sizes or related pore throat size distribution values. The trendline 1554 represents the pore size distribution. A shown by the trendline 1554, the pore throat size distribution can be non-zero, extend over a range of sizes, from $10^{-2}$ microns to greater than $10^1$ microns.

Figure 16:
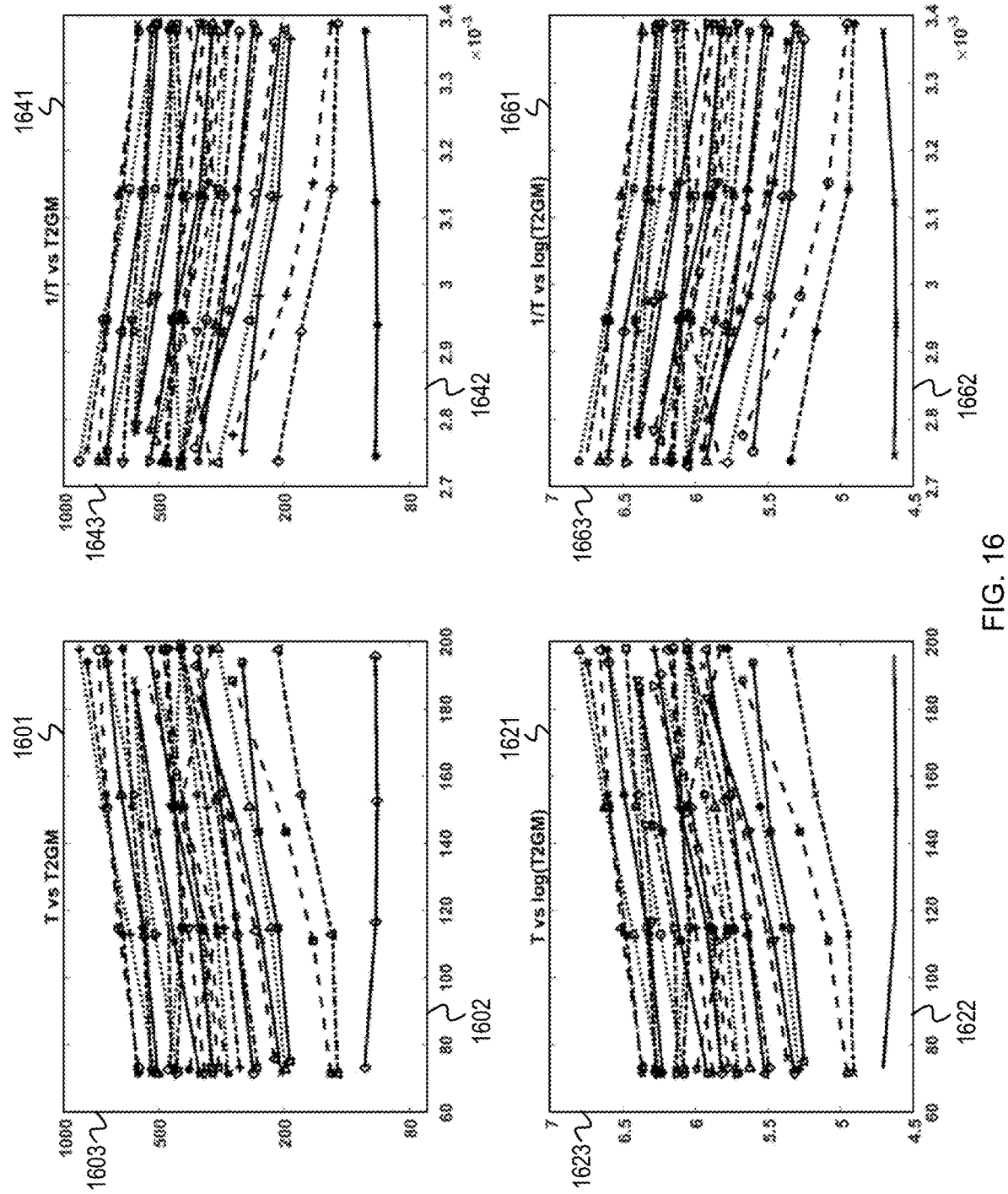
FIG. 16 shows a first set of correlation plots of temperature-based values and $T2_{GM}$-based values.

FIG. 16 shows a first set of correlation plots of temperature-based values and $T2_{GM}$-based values. The first plot 1601 has a horizontal axis 1602 representing temperature in the units of Fahrenheit and a vertical axis 1603 representing a $T2_{GM}$ value. The second plot 1621 has a horizontal axis 1622 representing temperature in the units of Fahrenheit and a vertical axis 1623 representing a $\log(T2_{GM})$ value. The third plot 1641 has a horizontal axis 1642 representing inverse temperature values in the units of 1/Kelvin and a vertical axis 1643 representing a $\log(T2_{GM})$ value. The fourth plot 1661 has a horizontal axis 1662 representing inverse temperature values in the units of 1/Kelvin and a vertical axis 1663 representing a $\log(T2_{GM})$ value.

As shown in each of the plots 1601, 1621, 1641 and 1644, some correlations between values based on temperature and values based on T2 distribution values can show a monotonic temperature dependency that can be approximated by a linear correlation with a substantially common slope. These correlations can be used to make temperature corrections for sample measurements. In some embodiments, one or more performance values such as the RMSE can be used to compare the performance of correlation models to determine a selected correlation model as described in the description for block 412 of FIG. 4 above. For example, RMSE values corresponding to the correlation models represented by FIG. 16 can be found in Table 1 above. As shown in Table 1 above, the lowest RMSE value is 9.2, which corresponds with the T vs. $\log(T2_{GM})$ correlation model. Based on having the least corresponding RMSE value, the T vs. $\log(T2_{GM})$ correlation model can be selected and used to generate Equation (3) and Equation (4), as described above.

Figure 17:
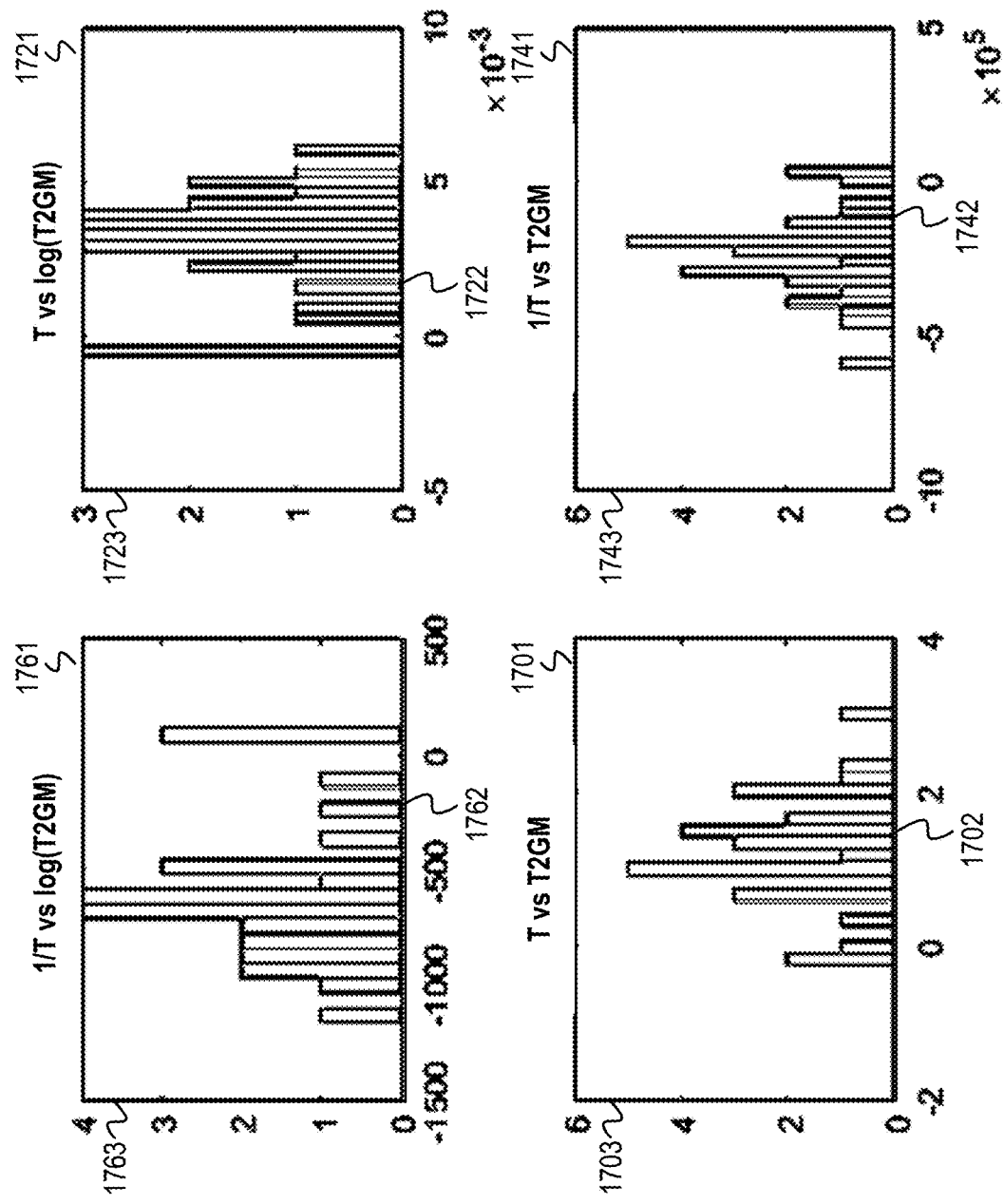
FIG. 17 shows a set of bar plots representing the slope distributions of the plots shown in FIG. 16.

FIG. 17 shows a set of bar plots representing the slope distributions of the plots shown in FIG. 16. The first plot 1701 represents the T vs. $T2_{GM}$ correlation model corresponding with the first plot 1601 and has a horizontal axis 1702 representing slope bins and a vertical axis 1703 representing the number of correlations within that corresponding slope bin. The second plot 1721 represents the T vs. $\log(T2_{GM})$ correlation model and has a horizontal axis 1722 representing slope bins and a vertical axis 1723 representing the number of correlations within that corresponding slope bin. The third plot 1741 represents the 1/T vs. $T2_{GM}$ correlation model and has a horizontal axis 1742 representing slope bins and a vertical axis 1743 representing the number of correlations within that corresponding slope bin. The fourth plot 1761 represents the 1/T vs. $\log(T2_{GM})$ correlation model and has a horizontal axis 1762 representing slope bins and a vertical axis 1763 representing the number of correlations within that corresponding slope bin.

As shown by a comparison of the standard deviation of the bars for the second plot 1721 in comparison to the bars of the other plots, the T vs. $\log(T2_{GM})$ correlation model has the least deviation of slopes amongst the four correlation models represented in FIG. 17.

Figure 18:
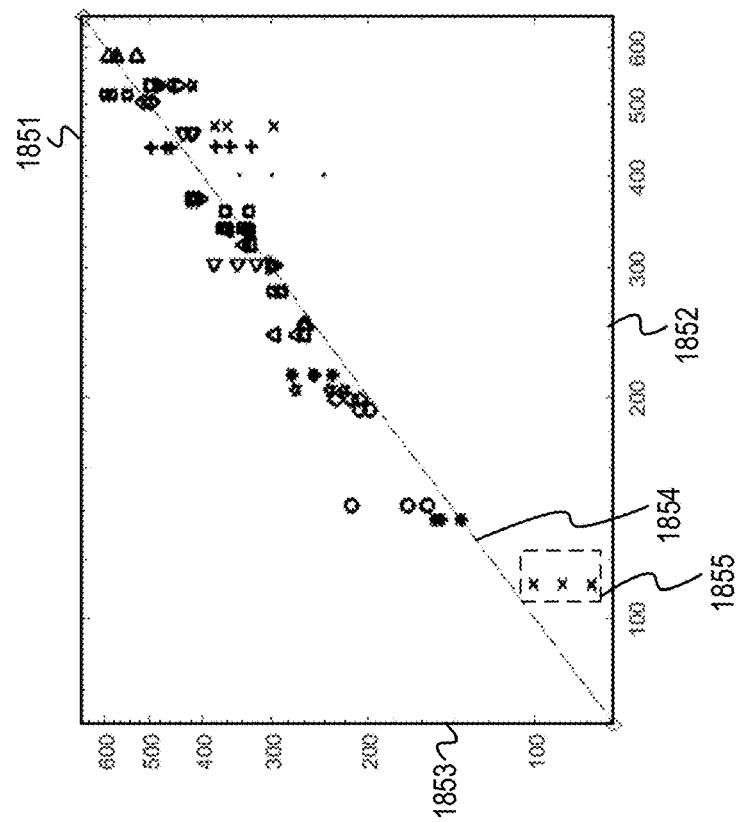
FIG. 18 shows a set of plots comparing predicted $T2_{GM}$ values with measured $T2_{GM}$ values.
Figure 18:
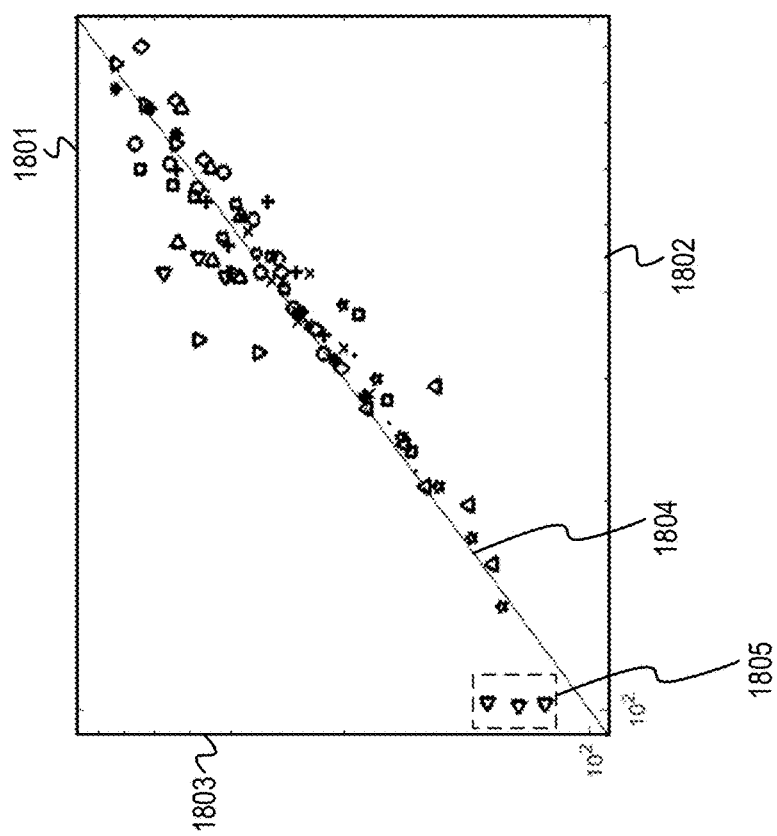

FIG. 18 shows a set of plots comparing predicted $T2_{GM}$ values with measured $T2_{GM}$ values. A first plot 1801 includes a vertical axis 1803 representing predicted $T2_{GM}$ values using Equation (11) and a horizontal axis 1802 representing actual measured $T2_{GM}$ values. The first plot 1801 includes a set of data points showing the comparison between the measured $T2_{GM}$ values in units of milliseconds and their corresponding predicted $T2_{GM}$ values in units of milliseconds, wherein each of the different shapes corresponding to the data points represent measurements using different core samples. As shown in the first plot 1801, the correlation between the measured and predicted values as represented by a trendline 1804 can be 0.90.

A second plot 1851 includes a vertical axis 1853 representing predicted $T2_{GM}$ values using Equation (12) and a horizontal axis 1852 representing actual measured $T2_{GM}$ values. The second plot 1851 includes a set of data points showing the comparison between the measured $T2_{GM}$ values in units of milliseconds and their corresponding predicted $T2_{GM}$ values in units of milliseconds. As shown in the second plot 1851, the performance of the correlation between the measured and predicted values as represented by a trendline 1854 in terms of R2 is 0.89. In some cases, a set of the data can be significantly different from what is predicted by a trendline, which can reduce the $R^2$ value of a correlation. For example, a subset of outlier data points in the region 1805 of the first plot 1801 and the region 1855 of the second plot 1851 show significant amount of difference from the trendlines 1804 and 1854, respectively.

Figure 19:
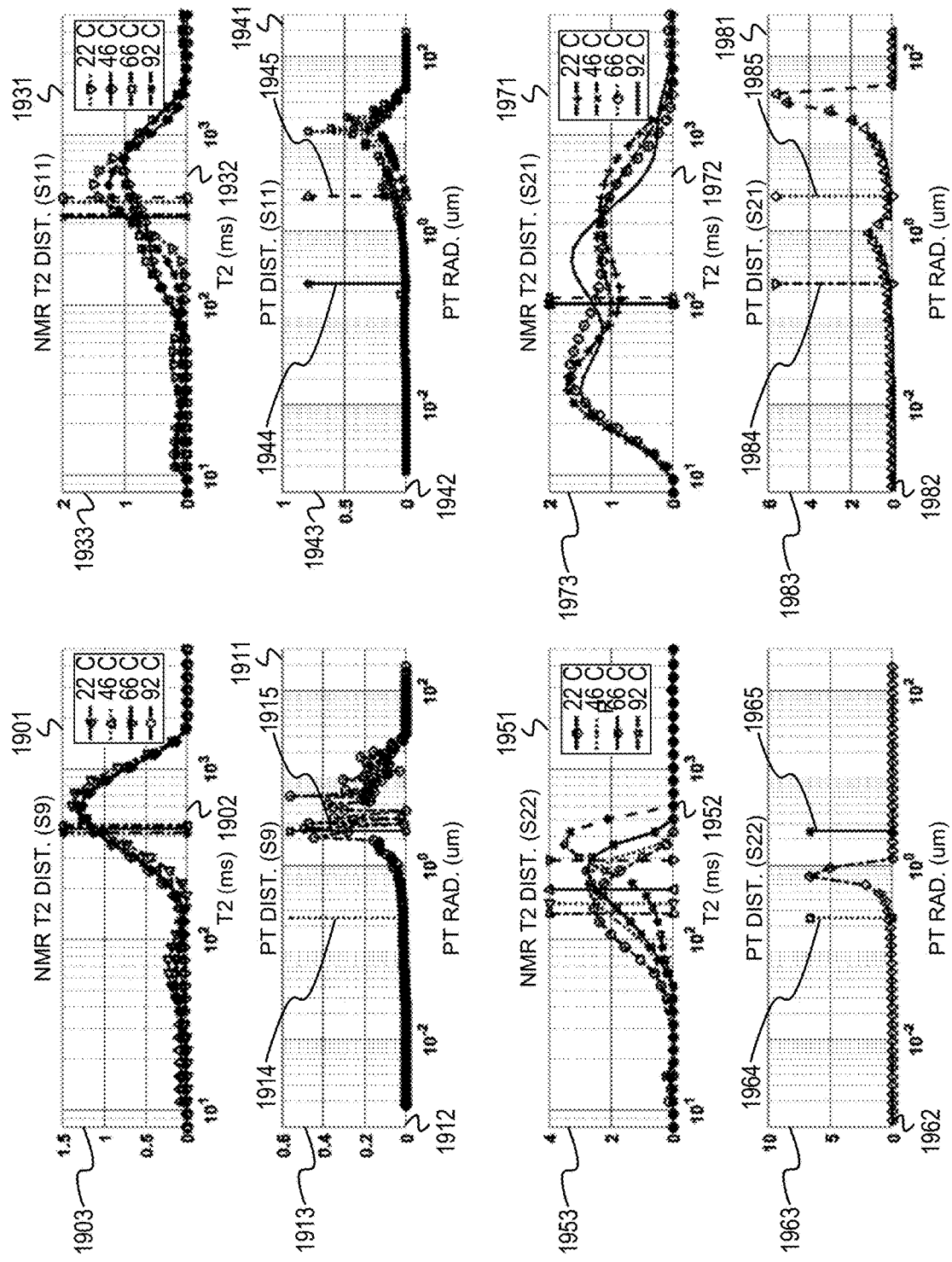
FIG. 19 shows a set of plots comparing pore throat radius distributions and T2 distributions at four different temperatures for a first set of four core samples.

FIG. 19 shows a set of plots comparing pore throat radius distributions and T2 distributions at four different temperatures for a first set of four core samples. A first NMR distribution plot 1901 represents a first T2 distribution at various temperatures for core sample labeled "S9." The first NMR distribution plot 1901 has a horizontal axis 1902 and a vertical axis 1903, wherein the horizontal axis 1902 represents time in milliseconds and the vertical axis 1903 represents a T2 distribution value for the core sample labeled "S9". The first NMR distribution plot 1901 has a corresponding first pore throat size distribution plot 1911. The first NMR distribution plot 1911 has a horizontal axis 1912 and a vertical axis 1913, wherein the horizontal axis 1912 represents pore throat radius in microns and the vertical axis 1903 represents a unitless distribution value. The vertical lines 1914-1915 represent the MicroCutoff and MacroCutoff values of 0.25 microns and 2.5 microns, respectively. As shown by the pore distribution trendline 1966, the majority of the pores in the samples are macropores, and a minority of the pore system is composed of mesopores and micropores. As used herein, a macropore is a pore having throat size greater than or equal to a MacroCutoff value, mesopore is a pore having a throat size greater than a MicroCutoff value and less than a MacroCutoff value, and a micropore is a pore having a throat size less than or equal to the MicroCutoff value.

A second NMR distribution plot 1931 represents a second T2 distribution at various temperatures for core sample labeled "S11." The second NMR distribution plot 1931 has a horizontal axis 1932 and a vertical axis 1933, wherein the horizontal axis 1932 represents time in milliseconds and the vertical axis 1933 represents a T2 distribution value for the core sample labeled "S11". The second NMR distribution plot 1931 has a corresponding second pore throat size distribution plot 1941. The second NMR distribution plot 1941 has a horizontal axis 1942 and a vertical axis 1943, wherein the horizontal axis 1942 represents pore throat radius in microns and the vertical axis 1933 represents a unitless distribution value. The vertical lines 1944-1945 represent the MicroCutoff and MacroCutoff values of 0.25 microns and 2.5 microns, respectively.

A third NMR distribution plot 1951 represents a third T2 distribution at various temperatures for core sample labeled "S22." The third NMR distribution plot 1951 has a horizontal axis 1952 and a vertical axis 1953, wherein the horizontal axis 1952 represents time in milliseconds and the vertical axis 1953 represents a T2 distribution value for the core sample labeled "S22". The third NMR distribution plot 1951 has a corresponding third pore throat size distribution plot 1961. The third NMR distribution plot 1961 has a horizontal axis 1962 and a vertical axis 1963, wherein the horizontal axis 1962 represents pore throat radius in microns and the vertical axis 1953 represents a unitless distribution value. The vertical lines 1964-1965 represent the MicroCutoff and MacroCutoff values of 0.25 microns and 2.5 microns, respectively.

A fourth NMR distribution plot 1971 represents a fourth T2 distribution at various temperatures for core sample labeled "S21." The fourth NMR distribution plot 1971 has a horizontal axis 1972 and a vertical axis 1973, wherein the horizontal axis 1972 represents time in milliseconds and the vertical axis 1973 represents a distribution value. The fourth NMR distribution plot 1971 has a corresponding fourth pore throat size distribution plot 1981. The fourth NMR distribution plot 1981 has a horizontal axis 1982 and a vertical axis 1983, wherein the horizontal axis 1982 represents pore throat radius in microns and the vertical axis 1973 represents a unitless distribution value. The vertical lines 1984-1985 represent the MicroCutoff and MacroCutoff values of 0.25 microns and 2.5 microns, respectively.

In some embodiments, the system can recognize that pore size distributions shown in the pore throat size distribution plots 1911, 1941, 1961 show a little porosity within the cutoff range of 0.25 microns to 2.5 microns. In some embodiments, a device or system can determine correlation outliers based on the values correlated with porosity sizes. For example, the device or system can use cutoff ranges, wherein the system can determine that values from core samples having greater than a threshold distribution amount (e.g. 20% of all detected pores) outside of the cutoff range are outlier values. For example, the pore throat size distribution shown in the second NMR distribution plot 1941 has a pore throat size distribution wherein more than 20% of the detected pores are outside of the cutoff range, and thus data corresponding to S11 can be declared to be outliers. Alternatively, or in addition, a device or system can set all values corresponding to core samples wherein the pores are almost entirely within the cutoff range to be outliers, wherein almost entirely can be defined as 90% or more. For example, the pore throat size distribution shown in the fourth NMR distribution plot 1981 has greater than 90% of the detected pores from the sample S22 to be inside of the cutoff range, and thus data corresponding to S22 can be determined to be outliers. In some embodiments, a device or system can re-generate one or more correlation models after filtering out outlier values from the datasets used to generate the correlation models. Alternatively, in some embodiments, the device or system can use no filters at all, wherein MicroCutoff and MacroCutoff values are not used to filter outliers.

Figure 20:
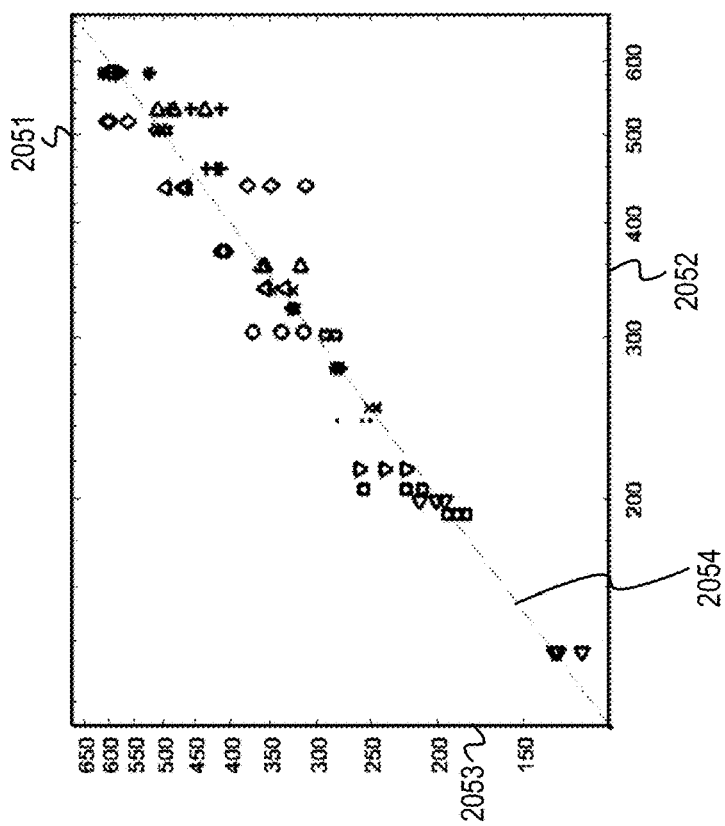
FIG. 20 shows a set of plots comparing predicted $T2_{GM}$ values with measured $T2_{GM}$ values after outlier removal.
Figure 20:
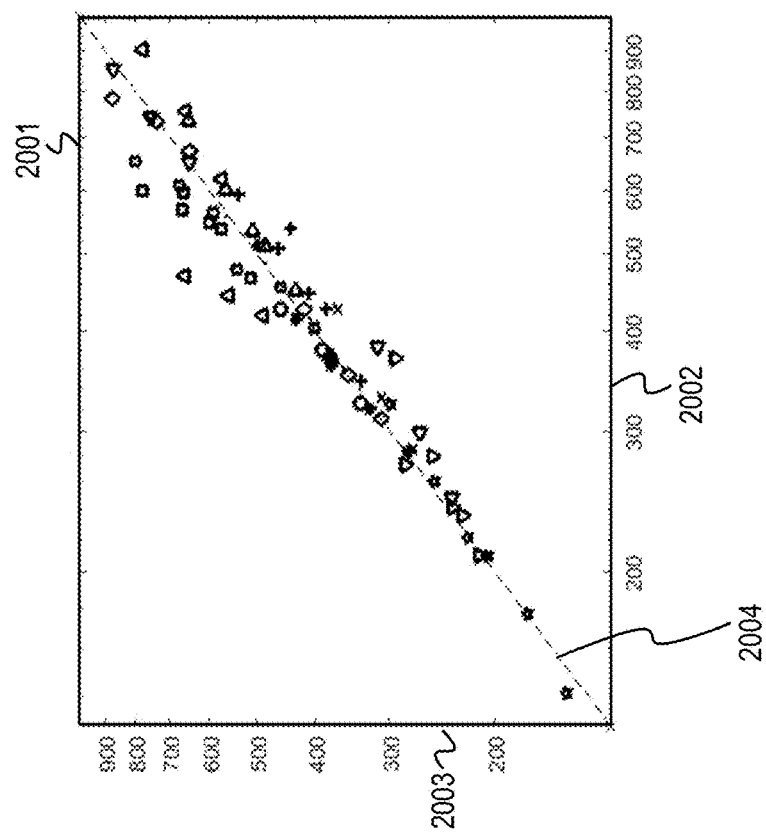

FIG. 20 shows a set of plots comparing predicted $T2_{GM}$ values with measured $T2_{GM}$ values after outlier removal. A first plot 2001 includes a vertical axis 2003 representing predicted $T2_{GM}$ values using Equation (13) and a horizontal axis 2002 representing actual measured $T2_{GM}$ values. The first plot 2001 includes a set of data points showing the comparison between the measured $T2_{GM}$ values in units of milliseconds and their corresponding predicted $T2_{GM}$ values in units of milliseconds. The set of data points in the first plot 2001 include the data points in the first plot 1801 of FIG. 18 after removing outlier data points. As shown in the first plot 2001, the correlation between the measured and predicted values as represented by a trendline 2004 can be 0.94, wherein the trendline 2004 can represent Equation (13). A second plot 2051 includes a vertical axis 2053 representing predicted $T2_{GM}$ values using Equation (14) and a horizontal axis 2052 representing actual measured $T2_{GM}$ values. The second plot 2051 includes a set of data points showing the comparison between the measured $T2_{GM}$ values in units of milliseconds and their corresponding predicted $T2_{GM}$ values in units of milliseconds. The set of data points in the second plot 2051 include the data points in the second plot 1851 of FIG. 18 after removing outlier data points. As shown in the second plot 2051, the correlation between the measured and predicted values as represented by a trendline 2054 can be 0.94, wherein the trendline 2054 can represent Equation (14). As shown in FIG. 20, removing the outliers can increase the correlation/predictive accuracy of the parameter correlation method.

Figure 21:
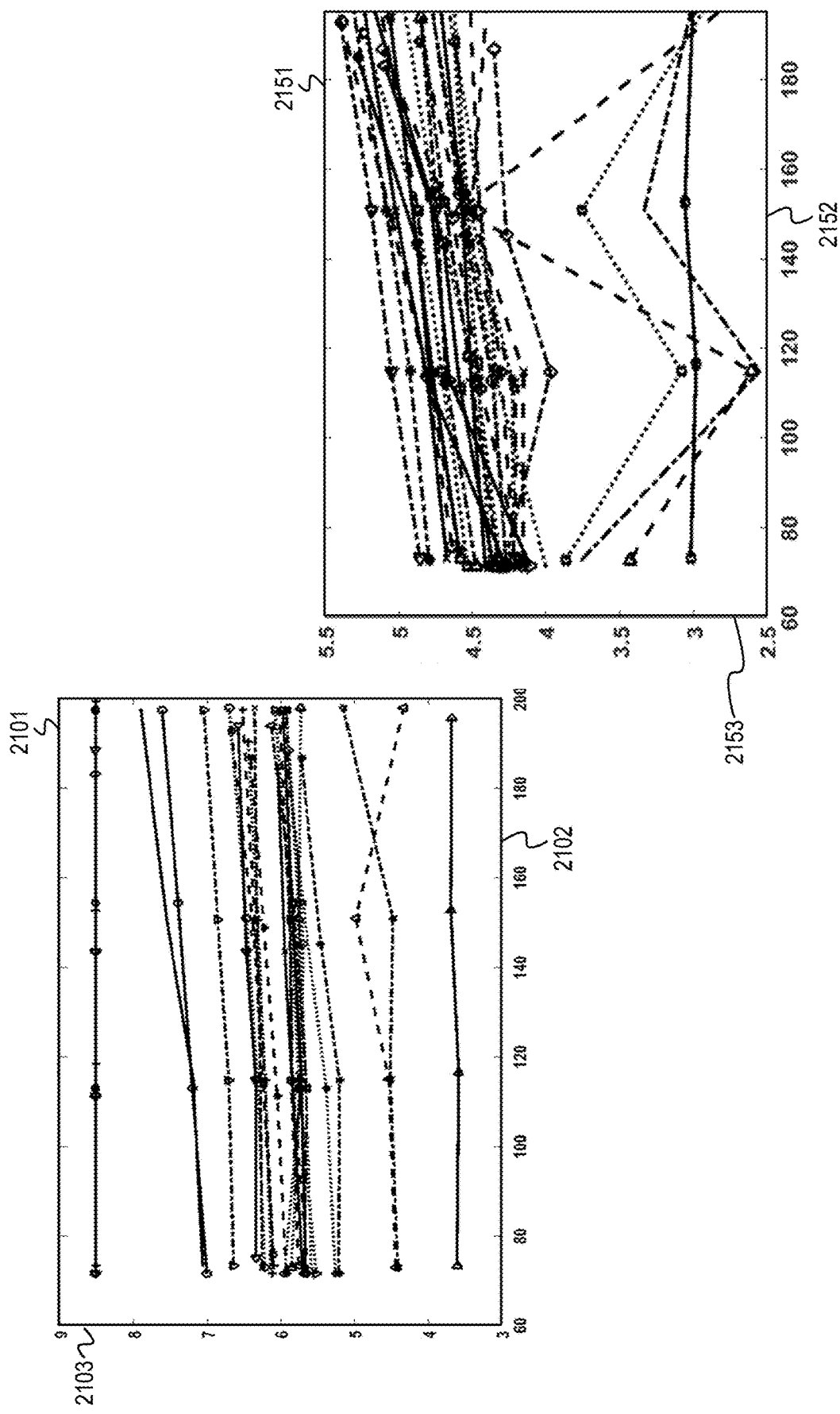
FIG. 21 shows a set of correlation plots of temperature-based values and cutoff values.

FIG. 21 shows a set of correlation plots of temperature-based values and cutoff values. The first plot 2101 has a horizontal axis 2102 representing temperature in the units of Fahrenheit and a vertical axis 2103 representing a log(MacroCutoff) value, wherein the MacroCutoff value can be in units of microns. The second plot 2151 has a horizontal axis 2122 representing temperature in the units of Fahrenheit and a vertical axis 2123 representing a log(MicroCutoff) value, wherein the MicroCutoff value can be in units of microns. In some embodiments, the corresponding micro and macro T2 cutoff for the T2 distributions at each temperature can be determined by matching the partial porosities from T2 distributions to the partial porosities from the pore throat distribution.

As shown in each of the plots 2101 and 2151, some correlations between values based on temperature and values based on T2 distribution values can show a monotonic temperature dependency that can be approximated by a linear correlation with a substantially common slope. These correlations can be used to make temperature corrections for sample measurements. In some embodiments, one or more performance values such as the RMSE can be used to compare the performance of correlation models. For example, RMSE values corresponding to the correlation models represented by FIG. 21 can be compared and the correlation model having the least corresponding RMSE value can be determined to be the selected correlation model as described in the description for block 412 of FIG. 4 above.

Figure 22:
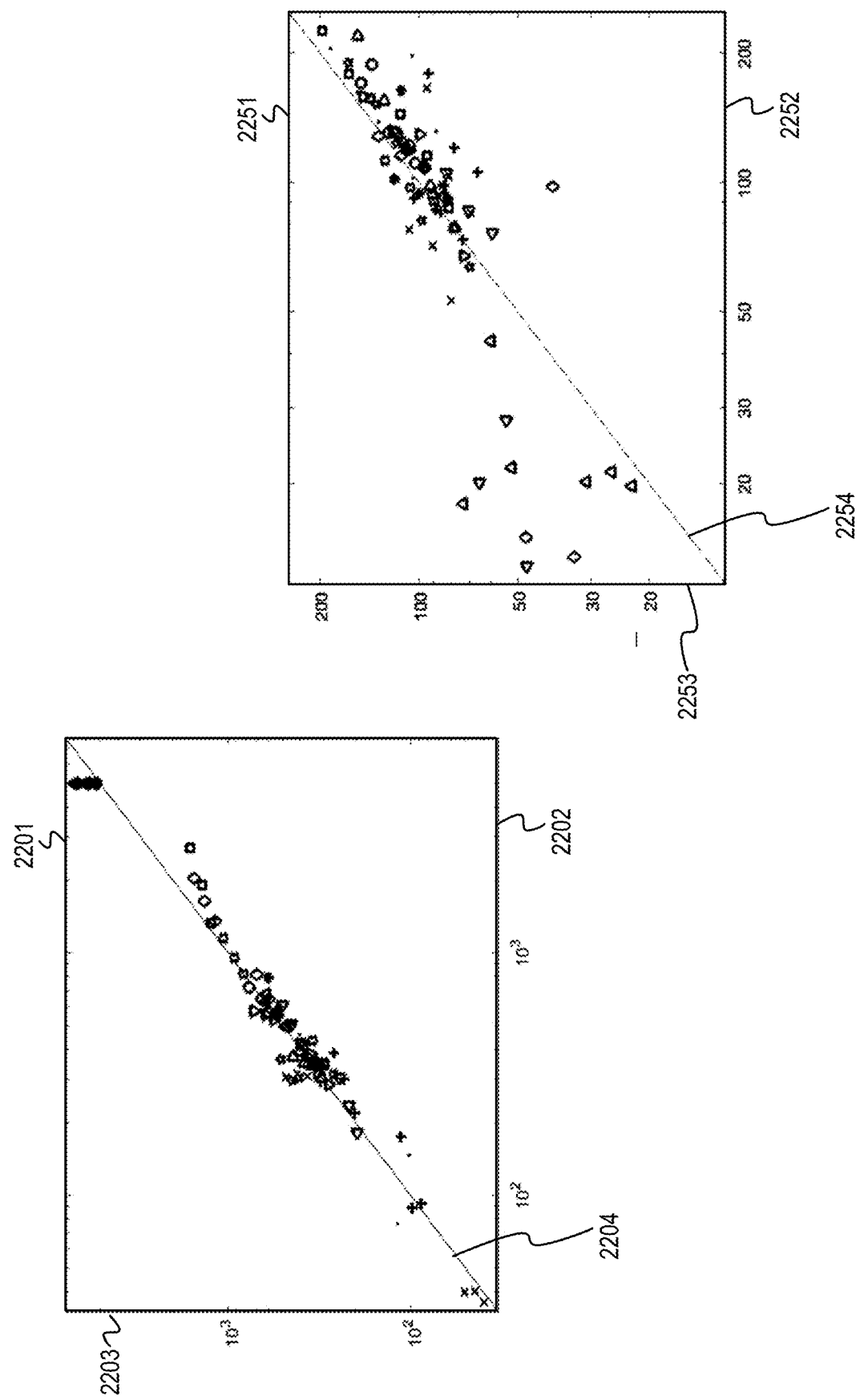
FIG. 22 shows a set of plots comparing predicted cutoff values with measured cutoff values.

FIG. 22 shows a set of plots comparing predicted cutoff values with measured cutoff values. A first plot 2201 includes a vertical axis 2203 representing predicted MacroCutoff values using Equation (16) and a horizontal axis 2202 representing measured MacroCutoff values. The first plot 2201 includes a set of data points showing the comparison between the measured MacroCutoff values in units of milliseconds and their corresponding predicted MacroCutoff values in units of milliseconds. As shown in the first plot 2201, the performance of the correlation between the measured and predicted values as represented by a trendline 2204 in terms of R2 is 0.0.97. A second plot 2251 includes a vertical axis 2253 representing predicted MicroCutoff values using Equation (15) and a horizontal axis 2252 representing measured MicroCutoff values. The second plot 2251 includes a set of data points showing the comparison between the measured MicroCutoff values in units of milliseconds and their corresponding predicted MicroCutoff values in units of milliseconds. As shown in the second plot 2251, the correlation between the measured and predicted values as represented by a trendline 2254 in terms of R2 is 0.65.

Figure 23:
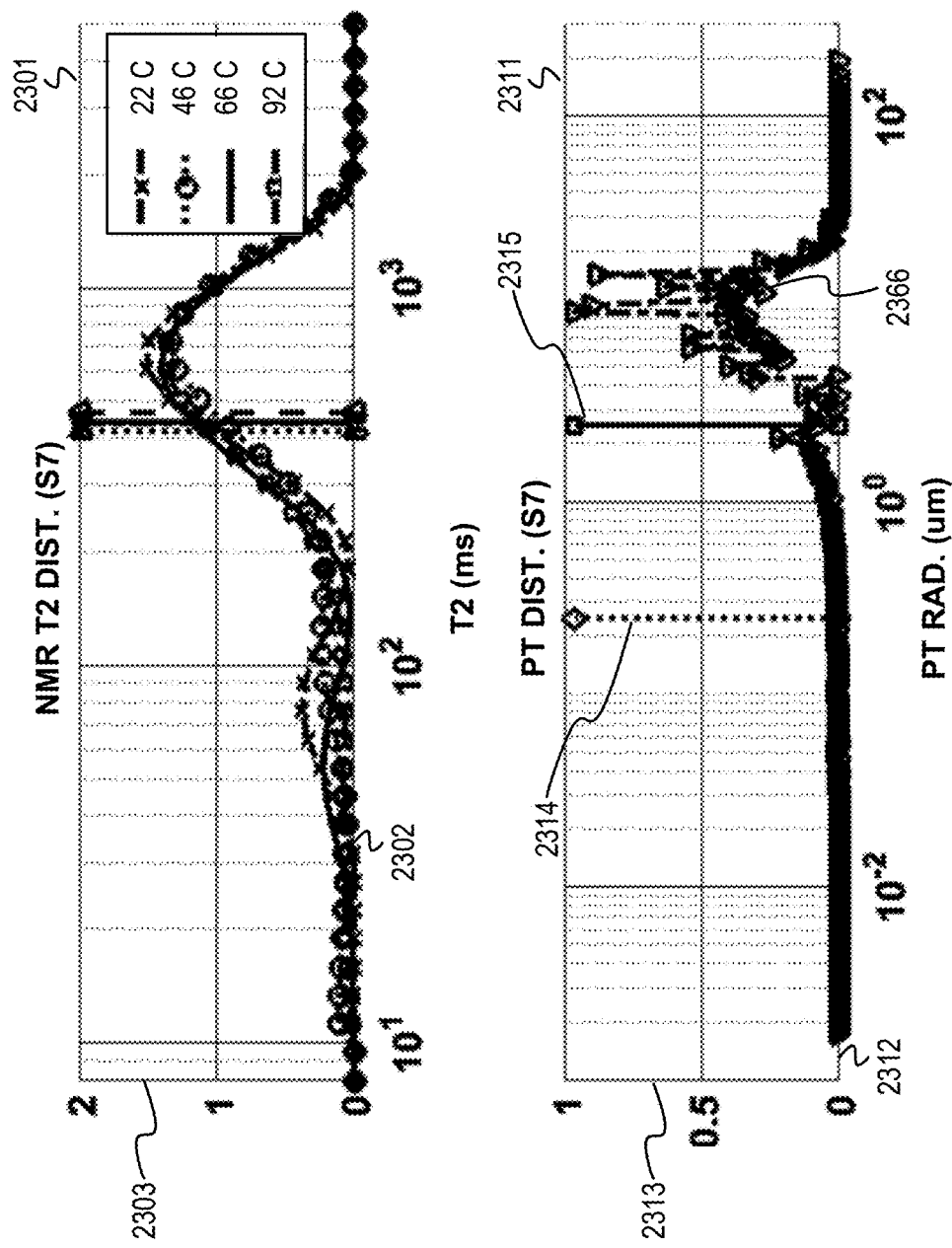
FIG. 23 shows a set of plots comparing pore throat radius distributions and T2 distributions at four different temperatures for four different core samples.

FIG. 23 shows a set of plots comparing pore throat radius distributions and T2 distributions at four different temperatures for four different core samples. A first NMR distribution plot 2301 represents a first T2 distribution at various temperatures for core sample labeled "S7." The first NMR distribution plot 2301 has a horizontal axis 2302 and a vertical axis 2303, wherein the horizontal axis 2302 represents time in milliseconds and the vertical axis 2303 represents a T2 distribution value for the core sample labeled "S7". The first NMR distribution plot 2301 has a corresponding first pore throat size distribution plot 2311. The first NMR distribution plot 2311 has a horizontal axis 2312 and a vertical axis 2313, wherein the horizontal axis 2312 represents pore throat radius in microns and the vertical axis 2303 represents a unitless distribution value. The vertical lines 2314-2315 represent the MicroCutoff and MacroCutoff values of 0.25 microns and 2.5 microns, respectively. As shown by the pore distribution trendline 2366, the majority of the pores in the samples are macro pores, and a minority of the pore system comprises mesopores and micropores, wherein macro pores are indicated by the pore distribution trendline 2366 being above the vertical line 2315 representing the MacroCutoff value.

Figure 24:
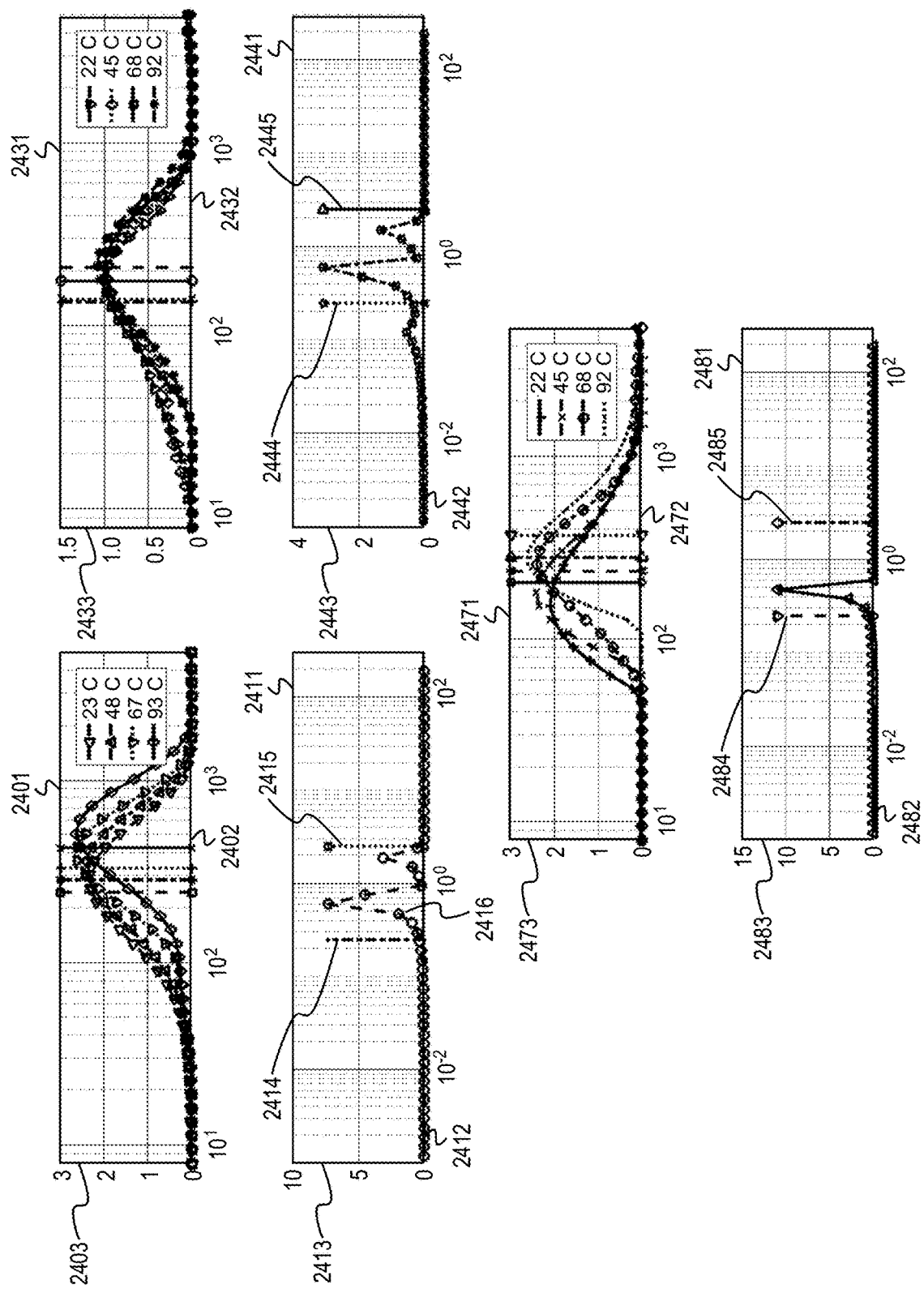
FIG. 24 shows a set of plots comparing pore throat radius distributions and T2 distributions at four different temperatures for a second set of four core samples.

FIG. 24 shows a set of plots comparing pore throat radius distributions and T2 distributions at four different temperatures for a second set of four core samples. A first NMR distribution plot 2401 represents a first T2 distribution at various temperatures for core sample labeled "S15." The first NMR distribution plot 2401 has a horizontal axis 2402 and a vertical axis 2403, wherein the horizontal axis 2402 represents time in milliseconds and the vertical axis 2403 represents a T2 distribution value for the core sample labeled "S15". The first NMR distribution plot 2401 has a corresponding first pore throat size distribution plot 2411. The first NMR distribution plot 2411 has a horizontal axis 2412 and a vertical axis 2413, wherein the horizontal axis 2412 represents pore throat radius in microns and the vertical axis 2403 represents a unitless distribution value. The vertical lines 2414-2415 represent the MicroCutoff and MacroCutoff values of 0.25 microns and 2.5 microns, respectively. As shown by the pore distribution trendline 2416, the majority of the pores in the samples are macro pores, and a minority of the pore system is composed of mesopores and micropores.

A second NMR distribution plot 2431 represents a second T2 distribution at various temperatures for core sample labeled "S19." The second NMR distribution plot 2431 has a horizontal axis 2432 and a vertical axis 2433, wherein the horizontal axis 2432 represents time in milliseconds and the vertical axis 2433 represents a T2 distribution value for the core sample labeled "S19". The second NMR distribution plot 2431 has a corresponding second pore throat size distribution plot 2441. The second NMR distribution plot 2441 has a horizontal axis 2442 and a vertical axis 2443, wherein the horizontal axis 2442 represents pore throat radius in microns and the vertical axis 2433 represents a unitless distribution value. The vertical lines 2444-2445 represent the MicroCutoff and MacroCutoff values of 0.25 microns and 2.5 microns, respectively.

A third NMR distribution plot 2471 represents a third T2 distribution at various temperatures for core sample labeled "S25." The third NMR distribution plot 2471 has a horizontal axis 2472 and a vertical axis 2473, wherein the horizontal axis 2472 represents time in milliseconds and the vertical axis 2473 represents a T2 distribution value for the core sample labeled "S25". The third NMR distribution plot 2471 has a corresponding third pore throat size distribution plot 2481. The third NMR distribution plot 2481 has a horizontal axis 2482 and a vertical axis 2483, wherein the horizontal axis 2482 represents pore throat radius in microns and the vertical axis 2473 represents a unitless distribution value. The vertical lines 2484-2485 represent the MicroCutoff and MacroCutoff values of 0.25 microns and 2.5 microns, respectively.

Figure 25:
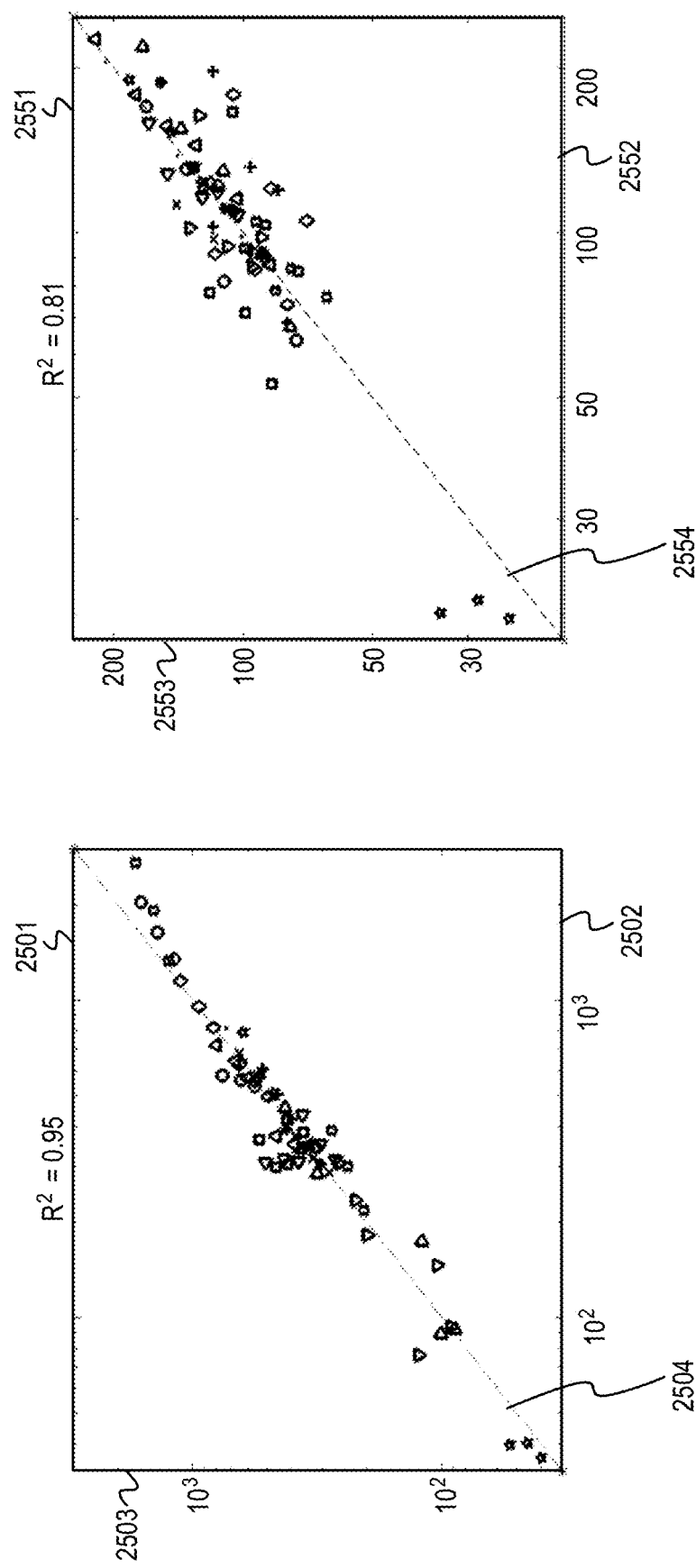
FIG. 25 shows a set of correlation plots of temperature-based values and cutoff values after outlier removal.

FIG. 25 shows a set of correlation plots of temperature-based values and cutoff values after outlier removal. A first plot 2501 includes a vertical axis 2503 representing predicted MacroCutoff values using Equation (18) and a horizontal axis 2502 representing measured MacroCutoff values. The first plot 2501 includes a set of data points showing the comparison between the measured MacroCutoff values in units of milliseconds and their corresponding predicted MacroCutoff values in units of milliseconds. The set of data points in the first plot 2501 use the data points in the first plot 2201 of FIG. 22 after removing outlier data points. As shown in the first plot 2501, the performance of the correlation between the measured and predicted values as represented by a trendline 2504 in terms of R2 is 0.95, wherein the trendline 2504 can be represented by Equation (18). A second plot 2551 includes a vertical axis 2553 representing predicted MicroCutoff values using Equation (17) and a horizontal axis 2552 representing measured MicroCutoff values. The second plot 2551 includes a set of data points showing the comparison between the measured MicroCutoff values in units of milliseconds and their corresponding predicted MicroCutoff values in units of milliseconds. The set of data points in the second plot 2551 use the data points in the first plot 2201 of FIG. 22 after removing outlier data points. As shown in the second plot 2551, the correlation between the measured and predicted values as represented by a trendline 2554 in terms of R2 is 0.81, wherein the trendline 2554 can be represented by Equation (17). As shown in FIG. 25, removing the outliers can increase the correlation/predictive accuracy of the parameter correlation method.

Example Computer Device

Figure 26:
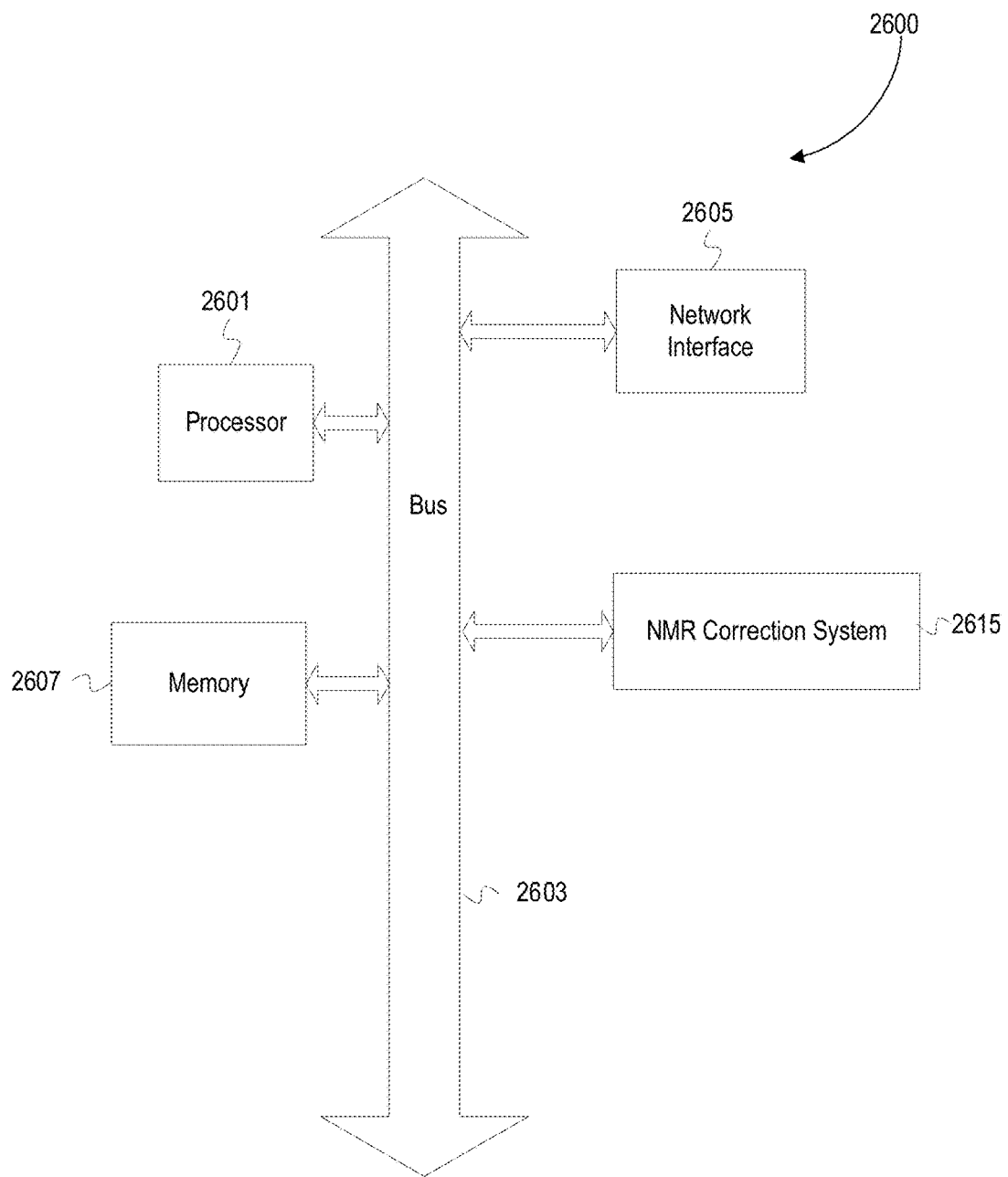
FIG. 26 depicts an example computer device.

FIG. 26 depicts an example computer device. The computer includes a processor 2601 (possibly including multiple processors, multiple cores, multiple nodes, and/or implementing multi-threading, etc.). The computer includes memory 2607. The memory 2607 may comprise system memory. Example system memory can include one or more of cache, static random access memory (RAM), dynamic RAM, zero capacitor RAM, Twin Transistor RAM, enhanced dynamic RAM, extended data output RAM, double data rate RAM, electrically erasable programmable read-only memory, nano RAM, resistive RAM, "silicon-oxide-nitride-oxide-silicon memory, parameter RAM, etc., and/or any one or more of the above already described possible realizations of machine-readable media. The computer device 2600 also includes a bus 2603. The bus 2603 can include buses such as Peripheral Component Interconnect (PCI), Industry Standard Architecture (ISA), PCI-Express, HyperTransport® bus, InfiniBand® bus, NuBus, etc. The computer device 2600 can also include a network interface 2605 (e.g., a Fiber Channel interface, an Ethernet interface, an internet small computer system interface, synchronous optical networking interface, wireless interface, etc.).

The computer also includes an NMR correction system 2615. The NMR correction system 2615 can control the different operations that can occur in the response to results from the analysis. For example, the NMR correction system 2615 can perform any of the operations described above with respect to FIGS. 1-4, regarding the use of NMR tools and/or analysis of NMR relaxation time distribution values. Any one of the previously described functionalities may be partially (or entirely) implemented in hardware and/or on the processor 2601. For example, the functionality may be implemented with an application specific integrated circuit, in logic implemented in the processor 2601, in a co-processor on a peripheral device or card, etc. Further, realizations may include fewer or additional components not illustrated in FIG. 26 (e.g., video cards, audio cards, additional network interfaces, peripheral devices, etc.). The processor 2601 and the network interface 2605 are coupled to the bus 2603. Although illustrated as being coupled to the bus 2603, the memory 2607 may be coupled to the processor 2601.

It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine-readable medium may be a machine-readable signal medium or a machine-readable storage medium. A machine-readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine-readable storage medium can include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain, or store a program for use by or in connection with an instruction execution system, apparatus, or device. A machine-readable storage medium is not a machine-readable signal medium.

A machine-readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine-readable signal medium may be any machine-readable medium that is not a machine-readable storage medium and that can communicate, propagate, or transport a program for use by or in connection with an instruction execution system, apparatus, or device.

Program code embodied on a machine-readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine-readable medium that can direct a machine to function in a particular manner, such that the instructions stored in the machine-readable medium produce an article of manufacture including instructions which implement the function/act specified in the flowchart and/or block diagram block or blocks.

Variations and Terminology

While the aspects of the disclosure are described with reference to various implementations and exploitations, it will be understood that these aspects are illustrative and that the scope of the claims is not limited to them. In general, techniques for processing and analyzing of particles from downhole as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed. A set of items can have only one item or more than one item. For example, a set of numbers can be used to describe a single number or multiple numbers.

Example Embodiments

Example embodiments include the following:

Embodiment 1 can comprise a method, the method comprising generating a temperature-corrected NMR measurement-derived value corresponding to a target temperature using at least one of a dimension-reduction operation and a parameter-correlation operation based on a difference between the target temperature and a sample temperature. Embodiment 1 can also comprise determining a formation property based on the temperature-corrected NMR measurement-derived value corresponding to the target temperature. Generating the temperature-corrected NMR measurement-derived value as described in Embodiment 1 can comprise generating an NMR relaxation time distribution. Generating the temperature-corrected NMR measurement-derived value as described in Embodiment 1 can also comprise generating at least one of a geometric mean of a T1 distribution, a geometric mean of a T2 distribution, a bound fluid cutoff value, and a pore cutoff value. In some cases, the sample temperature of Embodiment 1 can also be greater than the target temperature. Embodiment 1 can further comprise disposing a tool into a borehole of a formation and acquiring a sample NMR time distribution value corresponding with the sample temperature using the tool in the borehole, wherein the temperature-corrected NMR measurement-derived value is based on the sample NMR time distribution, and wherein the formation property corresponds to the formation.

Generating the temperature-corrected NMR measurement-derived value as described in Embodiment 1 can further comprise generating the temperature-corrected NMR measurement-derived value using the dimension-reduction operation. The dimension-reduction operation can further comprise generating a fitted, weighted set of calibration components based on a sample NMR time distribution value corresponding with the sample temperature and generating a set of temperature-corrected components based on the difference between the target temperature and the sample temperature, wherein determining the formation property comprises determining the formation property based on the set of temperature-corrected components. In some embodiments, a sum of the fitted, weighted set of calibration components is within an error threshold of corresponding sample NMR relaxation time distribution values that were acquired at the sample temperature. The preceding embodiments can further comprise acquiring a plurality of calibration NMR time distributions, wherein each of the calibration NMR time distributions are taken at different calibration temperatures. Any of the preceding embodiments can further comprise generating a set of calibration components based on the plurality of calibration NMR time distributions, wherein at least one of the fitted, weighted set of calibration components comprise one of the set of calibration components. Generating the set of calibration components as described in any of the preceding embodiments can further comprise application of principal component analysis to the plurality of calibration NMR time distributions.

Generating the temperature-corrected NMR measurement-derived value as described in the method of Embodiment 1 can further comprise generating the temperature-corrected NMR measurement-derived value using a correlation model that comprises a parameter value that varies with temperature. The parameter value of this embodiment can further comprise a first parameter, wherein the correlation model comprises a second parameter that is a function of at least one of a pore throat distribution value, a micro porosity cutoff, a macro porosity cutoff, a porosity value, a permeability value, or a pore throat size. The correlation model of any of the preceding embodiments can be a selected correlation model, and any of the preceding embodiments can further comprise acquiring a plurality of calibration NMR relaxation time distribution values at a set of calibration temperatures. Based on the plurality of calibration NMR relaxation time distribution values, any of the preceding embodiments can comprise generating a set of correlation models, wherein each of the set of correlation models comprise a different set of correlation parameters, and wherein each of the set of correlation models comprises a corresponding calibration performance value. Any of the preceding embodiments can also comprise selecting the selected correlation model from the set of correlation models based on a comparison of calibration performance values. The correlation model of any of the preceding embodiments can further comprise a linear relationship between a logarithm of a plurality of calibration NMR relaxation time distribution values and a set of calibration temperatures.

Embodiment 2 can comprise an apparatus, the apparatus comprising a nuclear magnetic resonance (NMR) tool, a processor, and a machine-readable medium having program code executable by the processor to cause the apparatus to generate a temperature-corrected NMR measurement-derived value corresponding to a target temperature using at least one of a dimension-reduction operation or a parameter-correlation operation based on a difference between the target temperature and a sample temperature, and determine a formation property based on the temperature-corrected NMR measurement-derived value corresponding to the target temperature.

The program code to cause the apparatus to generate the temperature-corrected NMR measurement-derived value as described in Embodiment 2 can further comprise program code to cause the apparatus to generate an NMR relaxation time distribution. The program code to cause the apparatus to generate the temperature-corrected NMR measurement-derived value as described in Embodiment 2 can further comprises program code to generate at least one of a geometric mean of a T1 distribution, a geometric mean of a T2 distribution, a bound fluid cutoff value, and a pore cutoff value. The program code to cause the apparatus to generate the temperature-corrected NMR measurement-derived value as described in Embodiment 2 can further comprises program code to cause the apparatus to use the dimension-reduction operation, and wherein the program code to use the dimension-reduction operation comprising instructions to cause the apparatus to generate a fitted, weighted set of weighted set of calibration components based on a sample NMR time distribution value corresponding with the sample temperature and generate a set of correction components based on the difference between the target temperature and the sample temperature, wherein determining the formation property comprises determining the formation property based on the set of correction components. The program code to cause the apparatus to generate the temperature-corrected NMR measurement-derived value as described in Embodiment 2 can further comprises program code to generate the temperature-corrected NMR measurement-derived value using a correlation model that comprises a parameter value that varies with temperature.

Embodiment 3: One or more non-transitory machine-readable media comprising program code for determine a formation property, the program code to generate a temperature-corrected NMR measurement-derived value corresponding to a target temperature using at least one of a dimension-reduction operation or a parameter-correlation operation based on a difference between the target temperature and a sample temperature and determine the formation property based on the temperature-corrected NMR measurement-derived value corresponding to the target temperature. The program code to generate the temperature-corrected NMR measurement-derived value as described in Embodiment 3 can further comprise program code to generate an NMR relaxation time distribution. The program code to generate the temperature-corrected NMR measurement-derived value as described in Embodiment 3 can further comprise program code to generate at least one of a geometric mean of a T1 distribution, a geometric mean of a T2 distribution, a bound fluid cutoff value, and a pore cutoff value.

What is claimed is:

1. A method comprising:
generating a temperature-corrected nuclear magnetic resonance (NMR) measurement-derived value corresponding to a target temperature using a dimension-reduction operation based on a principal component analysis (PCA) corresponding to a difference between the target temperature and a sample temperature; and
determining a formation property based on the temperature-corrected NMR measurement-derived value corresponding to the target temperature.

2. The method of claim 1, wherein generating the temperature-corrected NMR measurement-derived value comprises generating an NMR relaxation time distribution.

3. The method of claim 1, wherein generating the temperature-corrected NMR measurement-derived value comprises generating at least one of a geometric mean of a T1 distribution, a geometric mean of a T2 distribution, a bound fluid cutoff value, and a pore cutoff value.

4. The method of claim 1, wherein the sample temperature is greater than the target temperature.

5. The method of claim 1, further comprises:
disposing a tool into a borehole of a formation; and
acquiring a sample NMR time distribution value corresponding with the sample temperature using the tool in the borehole, wherein the temperature-corrected NMR measurement-derived value is based on the sample NMR time distribution, and wherein the formation property corresponds to the formation.

6. The method of claim 1, further comprising:
generating a fitted, weighted set of calibration components based on a sample NMR time distribution value corresponding with the sample temperature; and
generating a set of temperature-corrected components based on the difference between the target temperature and the sample temperature, wherein determining the formation property comprises determining the formation property based on the set of temperature-corrected components.

7. The method of claim 6, wherein a sum of the fitted, weighted set of calibration components is within an error threshold of corresponding sample NMR relaxation time distribution values that were acquired at the sample temperature.

8. The method of claim 6, further comprising:
acquiring a plurality of calibration NMR time distributions, wherein each of the calibration NMR time distributions are taken at different calibration temperatures; and
based on the plurality of calibration NMR time distributions, generating a set of calibration components, wherein at least one of the fitted, weighted set of calibration components comprise one of the set of calibration components.

9. The method of claim 8, wherein generating the set of calibration components comprises application of principal component analysis to the plurality of calibration NMR time distributions.

10. An apparatus comprising:
a nuclear magnetic resonance (NMR) tool;
a processor; and
a machine-readable medium having program code executable by the processor to cause the apparatus to,
generate a temperature-corrected NMR measurement-derived value corresponding to a target temperature using at least one of a dimension-reduction operation based on a principal component analysis (PCA) corresponding to a difference between the target temperature and a sample temperature, and
determine a formation property based on the temperature-corrected NMR measurement-derived value corresponding to the target temperature.

11. The apparatus of claim 10, wherein the program code to cause the apparatus to generate the temperature-corrected NMR measurement-derived value comprises program code to cause the apparatus to generate an NMR relaxation time distribution.

12. The apparatus of claim 10, wherein the program code to cause the apparatus to generate the temperature-corrected NMR measurement-derived value comprises program code to generate at least one of a geometric mean of a T1 distribution, a geometric mean of a T2 distribution, a bound fluid cutoff value, and a pore cutoff value.

13. The apparatus of claim 10, further comprising instructions to cause the apparatus to:
generate a fitted, weighted set of calibration components based on a sample NMR time distribution value corresponding with the sample temperature; and
generate a set of correction components based on the difference between the target temperature and the sample temperature, wherein determining the formation property comprises determining the formation property based on the set of correction components.

14. One or more non-transitory machine-readable media comprising program code for determining a formation property, the program code to:
generate a temperature-corrected nuclear magnetic resonance (NMR) measurement-derived value corresponding to a target temperature using a dimension-reduction operation based on a principal component analysis (PCA) corresponding to a difference between the target temperature and a sample temperature; and
determine the formation property based on the temperature-corrected NMR measurement-derived value corresponding to the target temperature.

15. The machine-readable media of claim 14, wherein the program code to generate the temperature-corrected NMR measurement-derived value comprises program code to generate an NMR relaxation time distribution.

16. The machine-readable media of claim 14, further comprising program code to:
generate a fitted, weighted set of calibration components based on a sample NMR time distribution value corresponding with the sample temperature;
generate a set of temperature-corrected components based on the difference between the target temperature and the sample temperature, wherein determining the formation property comprises determining the formation property based on the set of temperature-corrected components;
acquire a plurality of calibration NMR time distributions, wherein each of the calibration NMR time distributions are taken at different calibration temperatures; and
based on the plurality of calibration NMR time distributions, generate a set of calibration components, wherein at least one of the fitted, weighted set of calibration components comprise one of the set of calibration components, and wherein the program code to generate the set of calibration components comprises program code to apply principal component analysis to the plurality of calibration NMR time distributions.

17. The apparatus of claim 10, further comprising program code to:
generate a fitted, weighted set of calibration components based on a sample NMR time distribution value corresponding with the sample temperature; and
generate a set of temperature-corrected components based on the difference between the target temperature and the sample temperature, wherein determining the formation property comprises determining the formation property based on the set of temperature-corrected components.

18. The apparatus of claim 17, wherein a sum of the fitted, weighted set of calibration components is within an error threshold of corresponding sample NMR relaxation time distribution values that were acquired at the sample temperature.

19. The apparatus of claim 17, further comprising program code to:
acquire a plurality of calibration NMR time distributions, wherein each of the calibration NMR time distributions are taken at different calibration temperatures; and
based on the plurality of calibration NMR time distributions, generate a set of calibration components, wherein at least one of the fitted, weighted set of calibration components comprise one of the set of calibration components.

20. The apparatus of claim 19, wherein the program code to generate the set of calibration components comprises program code to apply principal component analysis to the plurality of calibration NMR time distributions.

* * * * *